US011785775B2

(12) United States Patent
Xu et al.

(10) Patent No.: US 11,785,775 B2
(45) Date of Patent: Oct. 10, 2023

(54) METHODS OF FORMING MICROELECTRONIC DEVICES, AND RELATED MICROELECTRONIC DEVICES, MEMORY DEVICES, AND ELECTRONIC SYSTEMS

(71) Applicant: Micron Technology, Inc., Boise, ID (US)

(72) Inventors: Lifang Xu, Boise, ID (US); Shuangqiang Luo, Boise, ID (US); Harsh Narendrakumar Jain, Boise, ID (US); Nancy M. Lomeli, Boise, ID (US); Christopher J. Larsen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 17/153,740

(22) Filed: Jan. 20, 2021

(65) Prior Publication Data

US 2022/0231031 A1 Jul. 21, 2022

(51) Int. Cl.
*H10B 43/35* (2023.01)
*H01L 23/522* (2006.01)
(Continued)

(52) U.S. Cl.
CPC ......... *H10B 43/35* (2023.02); *H01L 23/5226* (2013.01); *H01L 23/5283* (2013.01);
(Continued)

(58) Field of Classification Search
CPC ......... H01L 27/11582; H01L 27/11565; H01L 27/11575; H01L 27/11548; H01L 23/5283; H01L 27/1157; H01L 27/11524; H01L 27/11529; H01L 27/11556; H01L 27/11573; H01L 23/5226; H01L 23/562; H01L 43/40; H01L 43/50; H01L 25/0655; H10B 43/55; H10B 41/77; H10B 41/35;
(Continued)

(56) References Cited

U.S. PATENT DOCUMENTS

2017/0263556 A1\* 9/2017 Tessariol ............ H01L 23/5283
2017/0294383 A1\* 10/2017 Tanzawa ........... H01L 27/11575
2019/0139977 A1\* 5/2019 Lee .................. H01L 27/11524

\* cited by examiner

*Primary Examiner* — Galina G Yushina
(74) *Attorney, Agent, or Firm* — TraskBritt

(57) ABSTRACT

A method of forming a microelectronic device includes forming a microelectronic device structure. The microelectronic device structure includes a stack structure having an alternating sequence of conductive structures and insulative structures, an upper stadium structure, a lower stadium structure, and a crest region defined between a first stair step structure of the upper stadium structure and a second stair step structure of the lower stadium structure. The stack structure further includes pillar structures extending through the stack structure and dielectric structures interposed between neighboring pillar structures within the upper stadium structure. The method further includes forming a trench in the crest region of the stack structure between two dielectric structures of the dielectric structures on opposing sides of another dielectric structure and filling the trench with a dielectric material. The trench partially overlaps with the dielectric structures.

25 Claims, 19 Drawing Sheets

(51) Int. Cl.
*H01L 23/00* (2006.01)
*H01L 23/528* (2006.01)
*H10B 41/27* (2023.01)
*H10B 41/35* (2023.01)
*H10B 41/41* (2023.01)
*H10B 43/27* (2023.01)
*H10B 43/40* (2023.01)

(52) U.S. Cl.
CPC ............ *H01L 23/562* (2013.01); *H10B 41/27* (2023.02); *H10B 41/35* (2023.02); *H10B 41/41* (2023.02); *H10B 43/27* (2023.02); *H10B 43/40* (2023.02)

(58) Field of Classification Search
CPC ........ H10B 41/41; H10B 43/27; H10B 43/10; H10B 41/50
See application file for complete search history.

METHODS OF FORMING MICROELECTRONIC DEVICES, AND RELATED MICROELECTRONIC DEVICES, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (e.g., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions of the conductive structures, upon which conductive contact structures can be positioned to provide electrical access to the conductive structures.

As vertical memory array technology has advanced, enhanced memory density has been provided by forming memory devices to exhibit multiple deck (e.g., dual deck) configurations. For example, in one conventional dual deck configuration, some vertical memory strings are located in an upper deck (e.g., an upper stack structure), and additional vertical memory strings are located in a lower deck (e.g., a lower stack structure) underlying the upper deck. The vertical memory strings of the upper deck may be electrically coupled to the additional vertical memory strings of the lower deck (e.g., by way of conductive interconnect structures), or the vertical memory strings of the upper deck may be electrically isolated from the additional vertical memory strings of the lower deck (e.g., by way of an intervening dielectric material). Unfortunately, as feature packing densities have increased and margins for formation errors have decreased, conventional memory device formation methods and associated configurations and have resulted in undesirable stresses (e.g., access line contact over etch stresses), defects (e.g., access line contact punch through) and current leaks (e.g., select gate current leakage, access line current leakage) that can diminish desired memory device performance, reliability, and durability.

DETAILED DESCRIPTION

Figure 1A:
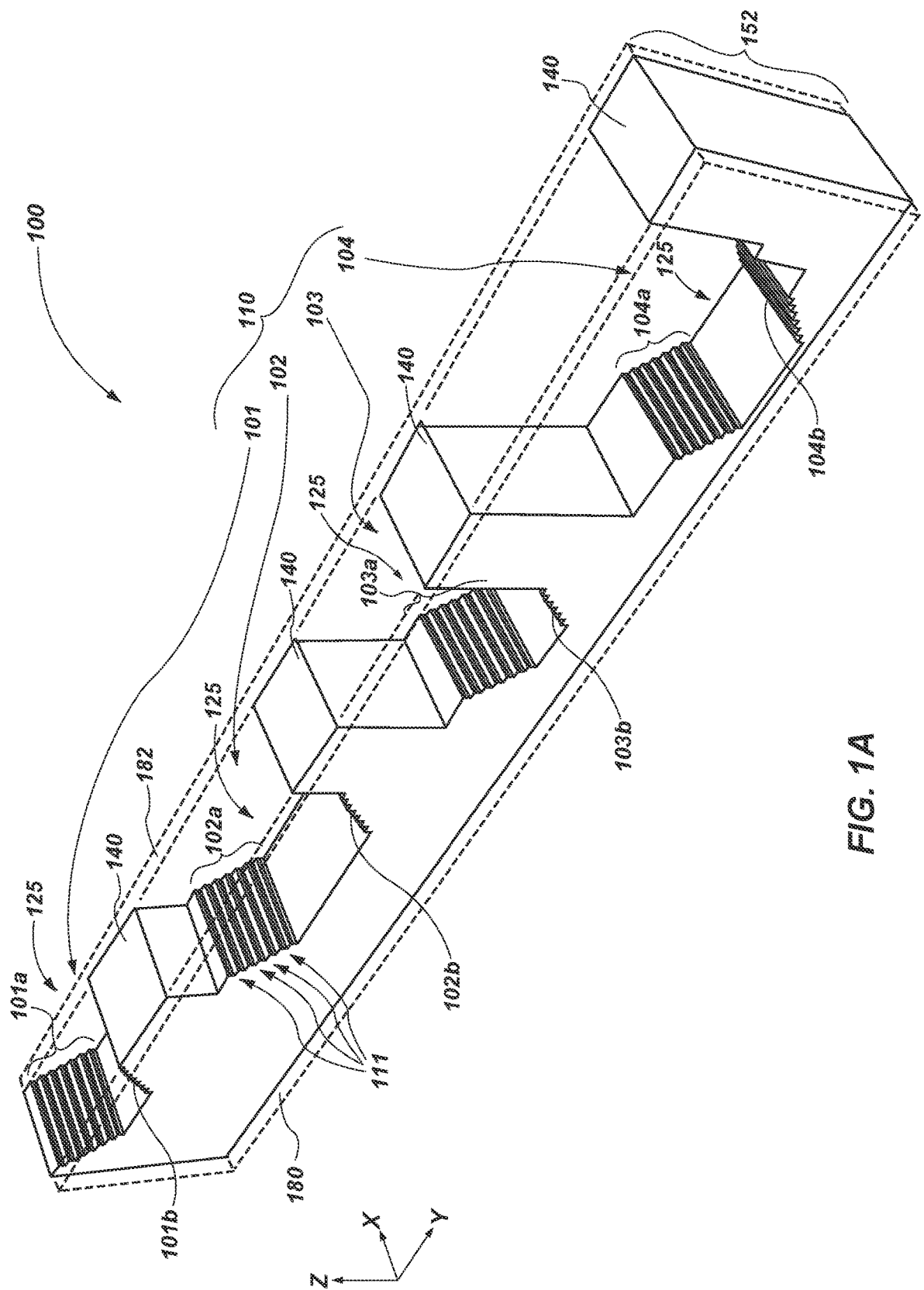
FIGS. 1A-1D are various views of a microelectronic device at a stage of a method of forming the microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting memory functionality, but not necessarily limited to memory functionality. Stated another way, and by way of non-limiting example only, the term "memory device" includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "middle," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of at least one feature (e.g., at least one structure, at least one region, at least one apparatus) facilitating operation of the at least one feature in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, a material is "selectively etchable" relative to another material if the material exhibits an etch rate that is at least about five times (5×) greater than the etch rate of another material during exposure to the same etching agent (e.g., etchant), such as about ten times (10×) greater, about twenty times (20×) greater, or about forty times (40×) greater.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise. Etch chemistries and etch conditions for etching a desired material may be selected by a person of ordinary skill in the art.

As used herein, the term "insulative material" includes one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulative structures 162 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, the term "conductive material" includes one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped polysilicon, conductively-doped germanium (Ge), conductively-doped silicon germanium (SiGe)), polysilicon, other materials exhibiting electrical conductivity, or combinations thereof.

Embodiments of the disclosure include microelectronic device structures for microelectronic devices (e.g., memory devices), as well as related microelectronic devices (e.g., memory devices), electronic systems, and methods. In some embodiments, a microelectronic device structure of the disclosure includes a stack structure having a vertically alternating sequence of conductive structures and insulative structures arranged in tiers. The stack structure further includes an upper segmented stadium structure comprising a first stair step structure having a negative slope facing (e.g., opposing, mirroring) an additional first stair step structure having a positive slope, a relatively lower segmented stadium structure comprising a second stair step structure having a negative slope facing an additional second stair step structure having a positive slope, and a crest region defined between the additional first stair step structure of the upper segmented stadium structure and the second stair step structure of the relatively lower stadium structure. The microelectronic device further includes support pillar structures extending vertically through the stack structure, dielectric filled slot structures interposed between horizontally neighboring support pillar structures within horizontal boundaries of the upper segmented stadium structure, and a filled trench vertically extending through at least the crest region of the stack structure. The filled trench may be formed between two dielectric filled slot structures on opposing sides of another dielectric filled slot structure of the dielectric filled slot structures and may separate a first group of upper select gates from a second group of upper select gates of the upper stadium structure within at least a portion of the crest region.

The trenches, which may be filled with a dielectric material may provide advantages over other manners of attempting to segregate a first group of upper select gate (e.g., drain side select gates (SGDs)) from a second group of upper select gates associated with (e.g., having contact areas within) an upper segmented stadium structure within a crest region of a microelectronic device structure. For example, due to elevated bridge portions of segmented stadium structures of the microelectronic device structure, shorting paths between the first group of upper select gates and the second group of upper select gates may exist within a crest region between the upper segmented stadium structure and a relatively lower, horizontally neighboring segmented stadium structure, and at least one filled trench may disrupt (e.g., remove) theses shorting paths. For example, the filled trench may be formed between the first group of upper select gates and the second group of upper select gates within the crest region of the microelectronic device structure. Because the filled trench extends into the crest region and between the first group of upper select gates and the second group of upper select gates, the filled trench physically and electrically separates portions of the first group of drain upper select gates from portions of the second group of upper select gates within the crest region. As a result, the filled trench may remove shorting paths between the first group of upper select gates and the second group of upper select gates within the crest region. Accordingly, the filled trench may prevent individual select gates within the first group of upper select gates from shorting with other individual select gates within the second group of upper select gates through and across the crest region.

Additionally, the trenches described herein are advantageous over forming horizontal barriers within the crest region (e.g., within the crest in a direction parallel to horizontal length of a given step of a stadium structure) to prevent shorting across the crest region. For example, due to manufacturing limitations, forming barriers in the above-described direction (e.g., patterning in the above-described direction) may create challenges in maintaining critical dimensions, and when critical dimensions of patterning in the above-described direction (e.g., X-direction of FIG. 1A) are increased, risks of under etching and over etching increase.

Furthermore, forming the trenches does not require forming relatively small features. Additionally, typical manufacturing processes would not involve significant structural changes (e.g., processing) within the microelectronic device structure after forming the trenches. Moreover, forming the trenches may be relatively accurate through eight, ten, fifteen, or more tiers of the stack structure.

As is described in greater detail below, a sequence from FIGS. 1A-1D to FIGS. 2A to 2C to FIGS. 3A-3C to FIGS. 4A-4C to FIGS. 5A-5C illustrates embodiments of a method of forming a microelectronic device (e.g., a memory device, such as a 3D NAND Flash memory device). The microelectronic device structure 100 may, for example, comprise a portion of a memory device (e.g., a multi-deck 3D NAND Flash memory device, such as a dual deck 3D NAND Flash memory device). With the description provided below, it will be readily apparent to one of ordinary skill in the art that the methods and structures described herein may be used for and in various devices and electronic systems.

FIGS. 1A-1D show various views of a microelectronic device structure 100 at a stage of forming a microelectronic device. FIG. 1A is a simplified perspective view of the microelectronic device structure 100, in accordance with embodiments of the disclosure. The microelectronic device structure 100 may represent a structure post (e.g., subsequent to) one or more so-called "replacement gate" or "gate last" processes. For example, the microelectronic device structure 100 may include a structure formed by at least partially replacing sacrificial materials (e.g., dielectric material, such as dielectric nitride material) of sacrificial structures with one or more electrically conductive materials (e.g., at least one metal, such as tungsten (W)). Replacement gate processing acts may include selectively removing (e.g., selectively etching and/or exhuming) portions of the sacrificial structures of a preliminary stack structure through slots formed in the preliminary stack structure, and filling the resulting void spaces with conductive material (e.g., W) to form the conductive structures. As is described herein, some of the conductive structures may function as access line structures (e.g., word line structures) for the microelectronic device structure 100, and some other of the conductive structures may function as select gate structures for the microelectronic device structure 100. At least one lower conductive structure of the resulting modified stack structure may be employed as at least one lower select gate (e.g., at least one source side select gate (SGS)) of the microelectronic device structure 100. In some embodiments, a single (e.g., only one) conductive structure of a vertically lowermost tier of the modified stack structure is employed as a lower select gate (e.g., a SGS) of the microelectronic device structure 100. In addition, upper conductive structures of the modified stack structure may be employed as upper select gates (e.g., drain side select gates (SGDs)) of the microelectronic device structure 100. In some embodiments, horizontally neighboring conductive structures of one or more vertically upper tiers of the modified stack structure are employed as upper select gates (e.g., SGDs) of the microelectronic device structure 100.

Figure 1B:
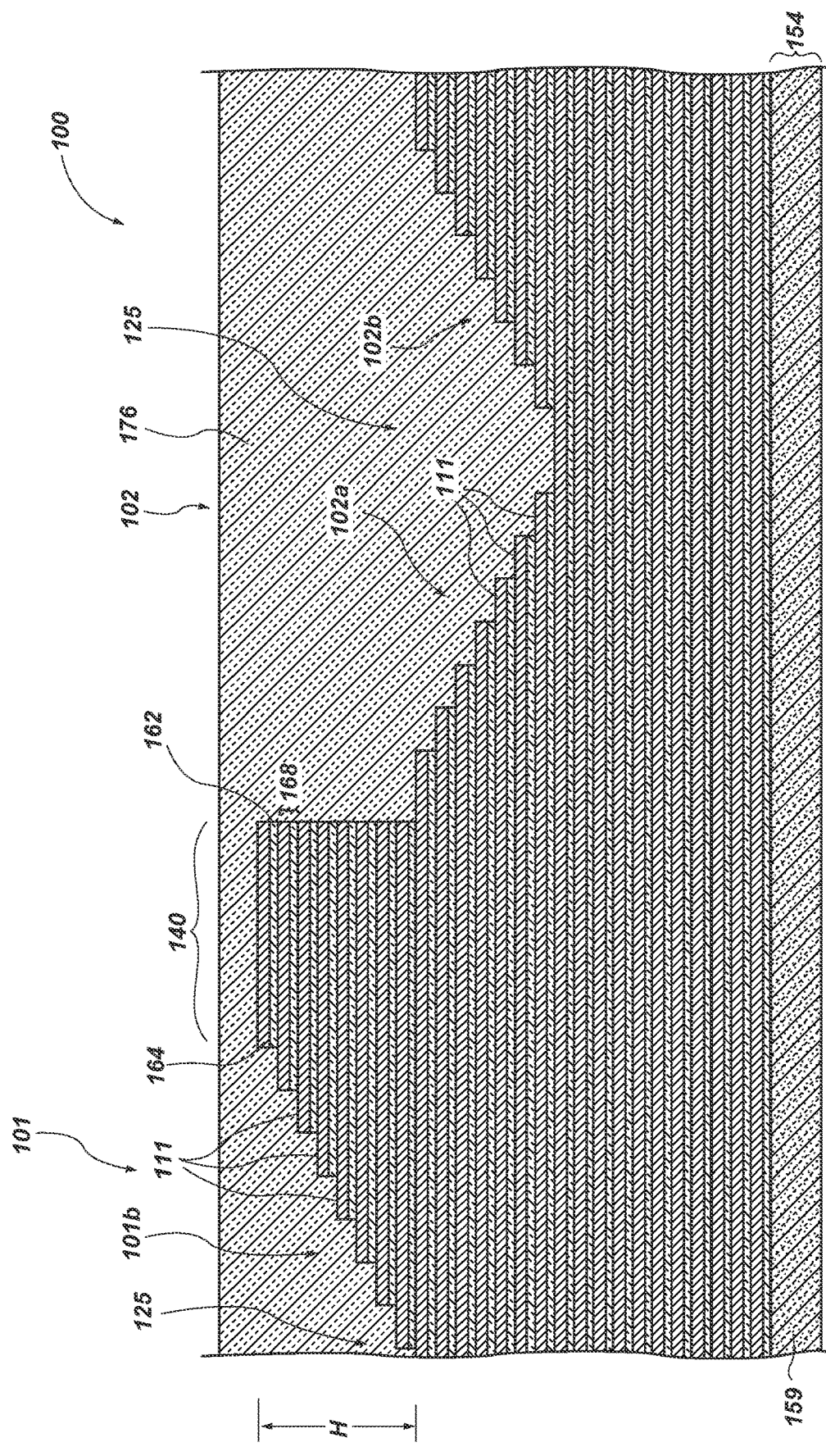
Figure 1C:
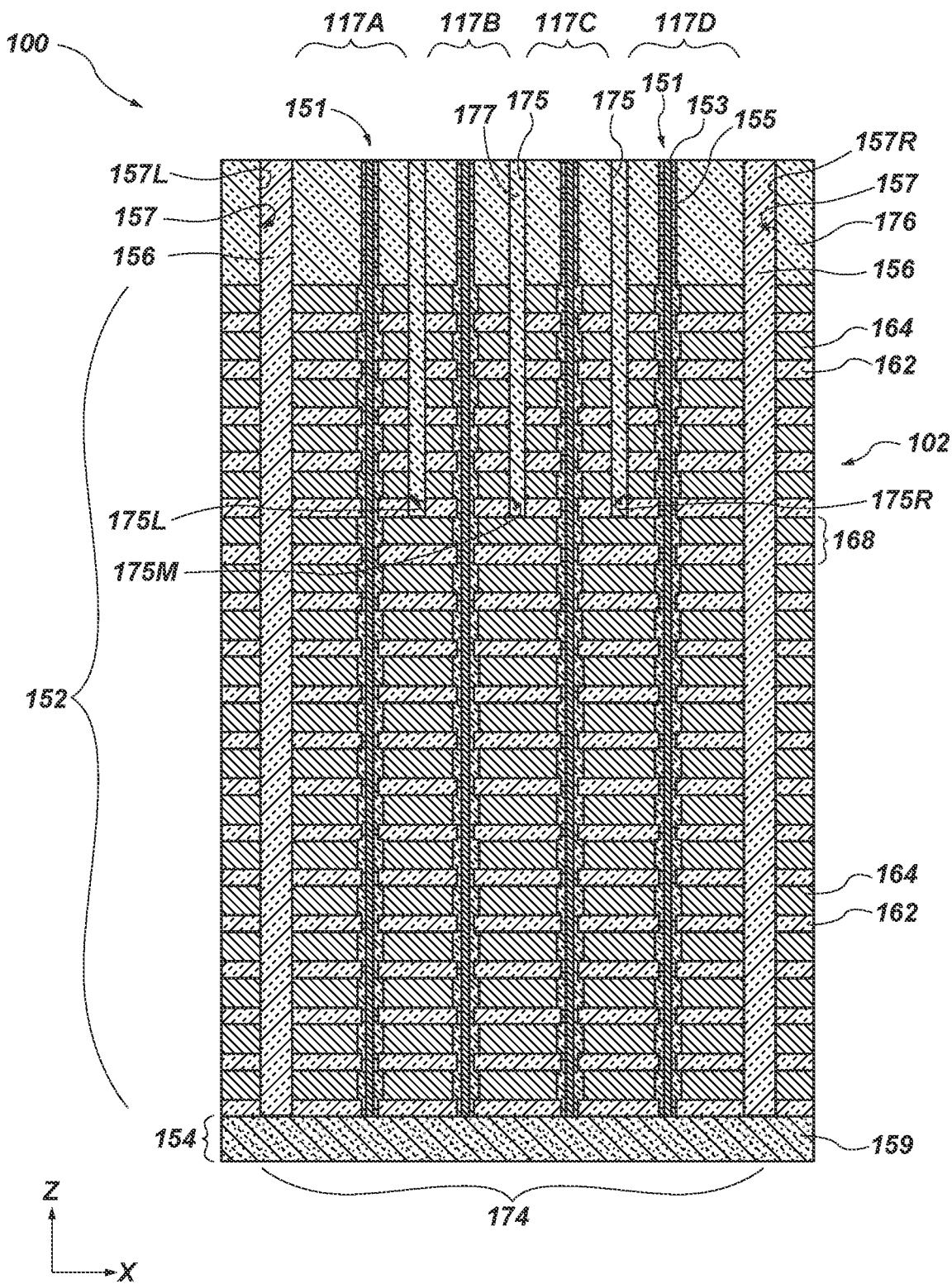
Figure 1D:
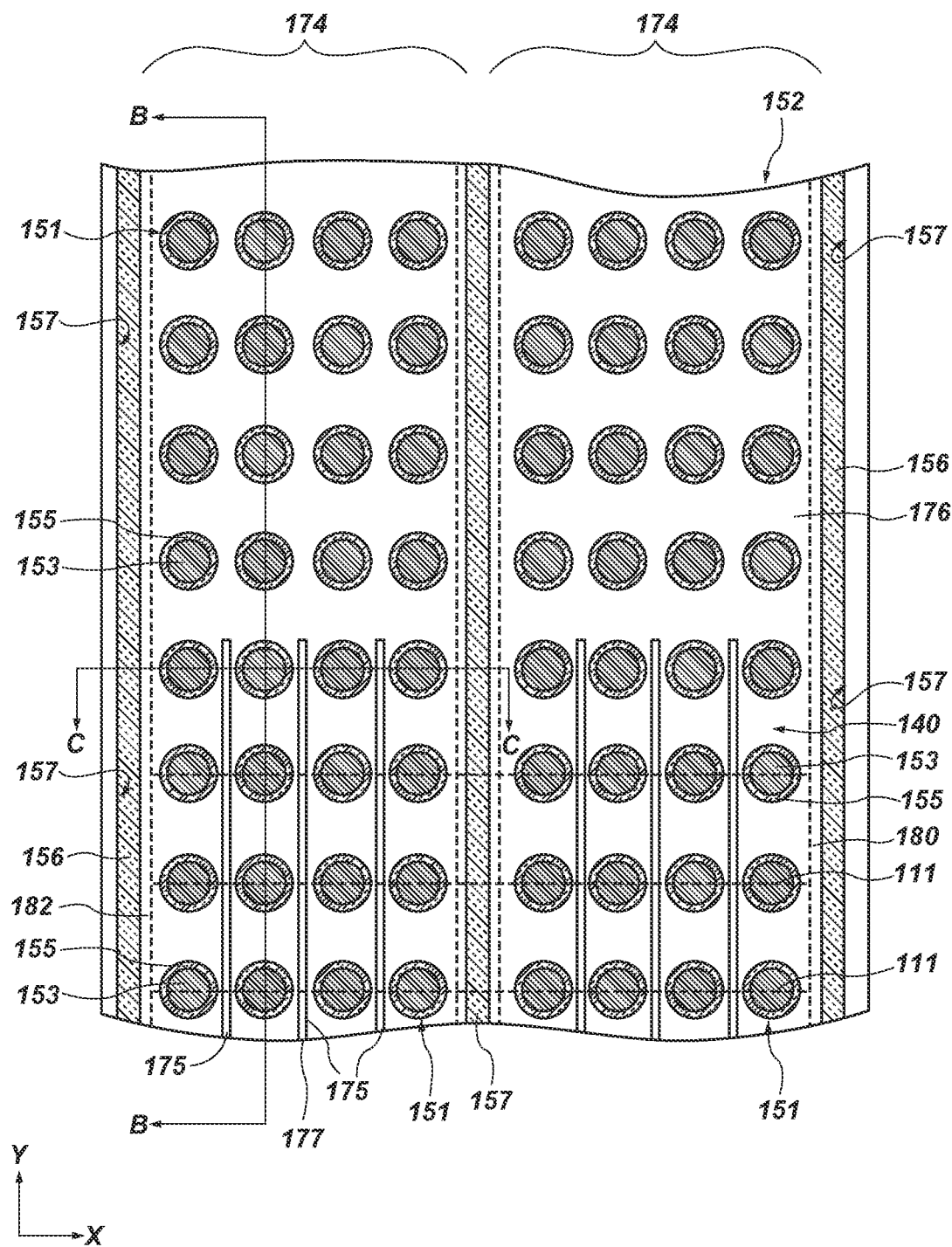

As shown in FIG. 1A and with reference to FIGS. 1B-1D, the microelectronic device structure 100 may include a stack structure 152 including vertically alternating sequence of conductive structures and insulative structures. The microelectronic device structure 100 may also include one or more segmented staircase structure(s) 110. For clarity, FIG. 1A only depicts a single block 174 (FIG. 1D) of the microelectronic device structure 100. In particular, a block 174 of the microelectronic device structure 100 may include a portion of the microelectronic device structure 100 between neighboring slot structures (e.g., first slot structures 157 (FIG. 1C)) utilized in replacement gate processes. An individual (e.g., single, one) block 174 may be interposed between two (2) horizontally neighboring slot structures (e.g., first slot structures 157). The microelectronic device structure 100 may include any number of blocks 174 oriented horizontally adjacent to each other, as shown in FIG. 1D. As used herein, the term "segmented" with reference to one or more staircase structure(s) of the microelectronic device structure 100 indicates that the staircase structure(s) of the microelectronic device structure 100 do not extend a full width of the microelectronic device structure 100 in the X-direction uninterrupted. Rather, the staircase structure(s) of the microelectronic device structure 100 may be segmented (e.g., divided) in the X-direction by elevated bridge structures 180, 182, and each segmented staircase structure may be defined between neighboring elevated bridge structures 180, 182. In FIG. 1A, the elevated bridge structures 180 are shown as transparent to better show other elements of the microelectronic device structure 100. The elevated bridge structures 180, 182 are described in greater detail below.

The one or more staircase structures may include steps 111, and the steps 111 of the staircase structure(s) 110 of the microelectronic device structure 100 may serve as contact regions for different tiers of conductive materials of the stack structure 152. The steps 111 may be located at horizontal ends of conductive structures and insulative structures located between neighboring conductive structures.

The staircase structure(s) 110 may include, for example, a first stadium structure 101, a second stadium structure 102, a third stadium structure 103, and a fourth stadium structure 104. Each of the first stadium structure 101, the second stadium structure 102, the third stadium structure 103, and the fourth stadium structure 104 may include steps 111 at different elevations (e.g., vertical positions in the Z-direction) relative to steps 111 of the other of the first stadium structure 101, the second stadium structure 102, the third stadium structure 103, and the fourth stadium structure 104. The first stadium structure 101 may include a first stair step structure 101a and an additional first stair step structure 101b; the second stadium structure 102 may include a second stair step structure 102a and an additional second stair step structure 102b; the third stadium structure 103 may include a third stair step structure 103a and an additional third stair step structure 103b; and the fourth stadium structure 104 may include a fourth stair step structure 104a and an additional fourth stair step structure 104b. The first stair step structure 101a, the second stair step structure 102a, the third stair step structure 103a, and the fourth stair step structure 104a may include steps 111 opposing and at the same elevation as the respective additional first stair step structure 101b, the additional second stair step structure 102b, the additional third stair step structure 103b, and the additional fourth stair step structure 104b. Each of the first stair step structure 101a, the second stair step structure 102a, the third stair step structure 103a, and the fourth stair step structure 104a may individually exhibit a generally negative slope; and each of the additional first stair step structure 101b, the additional second stair step structure 102b, the additional third stair step structure 103b, and the additional fourth stair step structure 104b may individually exhibit a generally positive slope.

In some embodiments, upper select gates (e.g., SGDs) may be located within boundaries (e.g., horizontal boundaries, vertical boundaries) of the first stadium structure 101 of the microelectronic device structure 100. As shown in FIG. 1A, valleys 125 may be located between the first stair step structure 101a and the additional first stair step structure 101b; between the second stair step structure 102a and the additional second stair step structure 102b; between the third stair step structure 103a and the additional third stair step structure 103b; and between the fourth stair step structure 104a and the additional fourth stair step structure 104b. In some embodiments, the valleys 125 may be filled with an insulative material 176 (FIG. 1B).

A region between neighboring stadium structures (e.g., the first stadium structure 101, the second stadium structure 102, the third stadium structure 103, and the fourth stadium structure 104) may comprise an elevated region 140, which may also be referred to as a "crest region 140."

As mentioned above, the microelectronic device structure 100 includes elevated bridge structures 180, 182. The elevated bridge structures 180, 182 may extend along a longitudinal dimension (e.g., height in the Z-direction) of an individual block 174 (FIG. 1D) of the microelectronic device structure 100. Furthermore, the elevated bridge structures 180, 182 may horizontally extend (e.g., in the Y-direction) along lateral sides of the individual block 174, across and between the opposing staircase structures of each of the stadium structures 101, 102, 103, 104 of the microelectronic device structure 100. In some embodiments, the elevated bridge structures 180, 182 may include unremoved portions of the stack structure 152 of microelectronic device structure 100 (e.g., portions of the stack structure 152 of microelectronic device structure 100 not removed in the process of forming the blocks 174 and the stadium structures 101, 102, 103, 104 within individual blocks 174). In one or more embodiments, the elevated bridge structures 180, 182 have a relatively uniform height along a longitudinal dimension of the individual block 174 of the microelectronic device structure 100.

As described in greater detail below, conductive contact structures, vertical conductive contacts may be formed to the electrically conductive portion of each tier (e.g., each step 111) of the stack structure 152 of the microelectronic device structure 100.

FIG. 1B and FIG. 1C are simplified partial cross-sectional views of the microelectronic device structure 100 of FIG. 1A, and FIG. 1D is a simplified top-down view of a portion of the first stadium structure 101 of the microelectronic device structure 100 of FIG. 1A, in accordance with embodiments of the disclosure. In particular, FIG. 1B is a cross-section of the microelectronic device structure 100 taken through section line B-B of FIG. 1D, and FIG. 1C is a cross-section of the microelectronic device structure 100 taken through section line C-C of FIG. 1D. In FIG. 1B, some elements of the microelectronic device structure 100 have been removed (e.g., support pillar structures (described)) for clarity in showing other elements of the microelectronic device structure 100. Additionally, each of FIGS. 1B and 1C represent a "slice" of the microelectronic device structure 100 of FIG. 1A such that elements of the microelectronic device structure 100 in the foreground and the background may not be depicted.

Referring to FIGS. 1B-1D together, the microelectronic device structure 100 may be formed to include the stack structure 152, a source tier 154 under the stack structure 152, dielectric structures 156 (e.g., a dielectric material deposited within previously made first slot structures 157 utilized during so called "replacement gate" or "gate last" processing acts) extending vertically into the stack structure 152. The microelectronic device structure 100 may further include support pillar structures 151 extending vertically (e.g., in the Z-direction) through at least a portion of the microelectronic device structure 100. The support pillar structures 151 are described in greater detail below.

The stack structure 152 includes a vertically alternating (e.g., in the Z-direction) sequence of insulative structures 162 and conductive structures 164 (e.g., gate structures, word lines) arranged in tiers 168. Each of the tiers 168 of the stack structure 152 may include at least one of the insulative structures 162 vertically neighboring at least one of the conductive structures 164. The stack structure 152 may include a desired quantity of the tiers 168. For example, the stack structure 152 may include greater than or equal to ten (10) of the tiers 168, greater than or equal to twenty-five (25) of the tiers 168, greater than or equal to fifty (50) of the tiers 168, greater than or equal to one hundred (100) of the tiers 168, greater than or equal to one hundred and fifty (150) of the tiers 168, or greater than or equal to two hundred (200) of the tiers 168 of the insulative structures 162 and the conductive structures 164.

The insulative structures 162 of the tiers 168 of the stack structure 152 may be formed of and include at least one electrically insulative material, such one or more of the insulative materials described above. In some embodiments, the insulative structures 162 are formed of and include $SiO_x$ (e.g., Sift). Each of the insulative structures 162 may individually include a substantially homogeneous distribution of the at least one electrically insulative material, or a substantially heterogeneous distribution of the at least one electrically insulative material. In some embodiments, each of the insulative structures 162 is substantially homogeneous. In additional embodiments, at least one of the insulative structures 162 substantially heterogeneous. The insulative structures 162 may, for example, be formed of and include a stack (e.g., laminate) of at least two different electrically insulative materials. The insulative structures 162 of each of the tiers 168 of the stack structure 152 may each be substantially planar, and may each individually exhibit a desired thickness.

The conductive structures 164 of each of the tiers 168 of the stack structure 152 may be formed of and include electrically conductive material, such as one or more of the conductive materials described above. For instance, as noted above, the conductive structures 164 may be formed of and include tungsten (W). The conductive structures 164 may be substantially homogeneous, or may be substantially heterogeneous. In some embodiments, the conductive structures 164 are substantially homogeneous. In additional embodiments, the conductive structures 164 are substantially heterogeneous. The conductive structures 164 of each of the tiers 168 of the stack structure 152 may each be substantially planar, and may each individually exhibit a desired thickness.

In some embodiments, the conductive structures 164 may include a conductive liner material around the conductive structures 164, such as between the conductive structures 164 and the insulative structures 162. The conductive liner material may comprise, for example, a seed material from which the conductive structures 164 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

As noted above, at least one lower conductive structure 164 of the stack structure 152 may be employed as at least one lower select gate (e.g., at least one source side select gate (SGS)) of the microelectronic device structure 100. In some embodiments, a single (e.g., only one) conductive structure 164 of a vertically lowermost tier 168 of the stack structure 152 is employed as a lower select gate (e.g., a SGS) of the microelectronic device structure 100. In addition, upper conductive structures 164 of the stack structure 152 may be employed as upper select gates (e.g., SGDs) of the microelectronic device structure 100. In some embodiments, horizontally neighboring conductive structures 164 of a vertically uppermost tier 168 of the stack structure 152 are employed as upper select gates (e.g., SGDs) of the microelectronic device structure 100.

The source tier 154 vertically underlies (e.g., in the Z-direction) the stack structure 152 and includes at least one source structure 159 (e.g., a source plate). The source structure 159 may be formed of and include at least one electrically conductive material, such as one or more of the conductive materials described above. In some embodiments, the source tier 154 includes the at least one source structure 159 and one or more discrete structures.

Referring to FIGS. 1A-1D together, the steps 111 (e.g., contact regions) of the staircase structures 110 of the microelectronic device structure 100 may be defined by horizontal edges (e.g., horizontal ends) of the tiers 168. The quantity of steps 111 included in the staircase structure(s) 110 may be substantially the same as (e.g., equal to) or may be different than (e.g., less than, greater than) the quantity of tiers 168 in each stack structure 152. In some embodiments, the steps 111 of the staircase structure(s) 110 are arranged in order, such that steps 111 directly horizontally neighboring one another in the X-direction correspond to tiers 168 of the stack structure 152 directly vertically adjacent (e.g., in the Z-direction) one another. In additional embodiments, the steps 111 of the staircase structure(s) 110 are arranged out of order, such that at least some steps 111 of the staircase structure(s) 110 directly horizontally neighboring one another in the X-direction correspond to tiers 168 of stack structure 152 not directly vertically neighboring (e.g., in the Z-direction) one another.

A height H (e.g., in the Z-direction) of an individual staircase structures 110 between an uppermost step 111 and a lowermost step 111 of the staircase structure 110 may be within a range from about 5.0 μm to about 20.0 such as from about 5 microns (μm) to about 10.0 from about 10.0 μm to about 15.0 or from about 15.0 μm to about 20.0 In some embodiments, the height H is about 13.5 However, the disclosure is not so limited and the height H may be different than those described.

The insulative material 176 (not depicted in FIG. 1A) may overlie the staircase structure(s) 110 and provide electrical insulation between components thereof. The insulative material 176 may be formed of and include one or more of the insulative materials described above with reference to the insulative structures 162. In some embodiments, the insulative material 176 comprises the same material composition as the insulative structures 162. In some embodiments, the insulative material 176 comprises silicon dioxide.

Referring to FIG. 1D, the stack structure 152 may be partitioned in the Y-direction orthogonal to the X-direction by the first slot structures 157. The first slot structures 157 may vertically extend (e.g., in the Z-direction shown in FIG. 1A) into the stack structure 152. The first slot structures 157 may, for example, vertically extend completely through the stack structure 152 and to, for example, the source tier 154. The first slot structures 157 may divide (e.g., in the Y-direction) the stack structure 152 into multiple blocks 174. As noted above, the first slot structures 157 may, for example, be employed to form the conductive structures 164 of the stack structure 152 through so-called "replacement gate" or "gate last" processing acts. As noted above, the first slot structures 157 may be filled within a dielectric material and may form dielectric structures 156. The dielectric material may include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), or at least one dielectric carboxynitride material (e.g., $SiO_xC_zN_y$). In some embodiments, the dielectric structures 156 are formed of and include $SiO_x$ (e.g., Sift).

Additionally, in one or more embodiments, the elevated bridge structures 180, 182 may be formed adjacent to the first slot structures 157 defining the bounds of the blocks 174 in the X-direction. Furthermore, referring to FIGS. 1C and 1D together, the elevated bridge structures 180, 182 may include portions of a first group of upper select gates 117A (FIG. 1C) and a fourth group of upper select gates 117D. Moreover, because the portions of the first group of upper select gates 117A and the fourth group of upper select gates 117D within the elevated bridge structures 180, 182 remain unremoved, shorting paths between the first group of upper select gates 117A and the fourth group of upper select gates 117D may remain within the crest region 140 (FIG. 1A).

In some embodiments, at least some (e.g., all) of the blocks 174 may be subdivided with second slot structures 175 located at, for example, end portions (in the Y-direction) of the staircase structure(s) 110 to subdivide (in the Y-direction) the blocks 174 into multiple sub-blocks. Within an individual block 174, the second slot structures 175 may further divide upper tiers 168 of the stack structure 152 so that the uppermost conductive structures 164 of the upper tiers 168 may be employed as upper select gates of the block 174 of the stack structure 152. For example, as shown in FIG. 1C, each of the second slot structures 175 may be formed between neighboring support pillar structures 151 of an individual block 174. The second slot structures 175 may vertically extend (e.g., in the Z-direction) through the insulative material 176 and one or more (e.g., two or more) of upper tiers 168 of the stack structure 152. The second slot structures 175 may disrupt (e.g., terminate) the horizontal continuity of the insulative material 176, the insulative structures 162 of the upper tiers 168, and the conductive structures 164 of the upper tiers 168. The second slot structures 175 may terminate (e.g., end) at upper surfaces of the conductive structure(s) 164 of an individual tier 168. For example, lower vertical boundaries of the second slot structures 175 may be substantially coplanar with upper surfaces of conductive structure(s) 164 of an individual tier 168 of the stack structure 152, as depicted in FIG. 1C. In other embodiments, the second slot structures 175 terminate within the vertical boundaries of the conductive structure(s) 164 of an upper tier 168 of the stack structure 152. In further embodiments, the second slot structures 175 terminate within vertical boundaries of the insulative structure(s) 162 of an upper tier 168 of the stack structure 152. In some embodiments, each of the second slot structures 175 extends to substantially the same vertical depth as each other of the second slot structures 175. In some embodiments, the second slot structures 175 may include slots filled with a dielectric material to form dielectric structures 177. The dielectric material may include one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, $MgO_x$, and a high-aspect-ratio process (HARP) oxide.

Additionally, the second slot structures 175 may at least partially define groups of upper select gates (e.g., SGDs) extending in the Z-direction. For example, within each block 174, the second slot structures 175 may define at least a first group of upper select gates 117A, a second group of upper select gates 117B, a third group of upper select gates 117C, and a fourth group of upper select gates 117D. As depicted in FIG. 1C, and according to the view depicted in FIG. 1C, in the X-direction, the first group of upper select gates 117A may be defined between a leftmost slot structure 157L and associated dielectric structure 156 and a leftmost second slot structure 175L and associated dielectric structure 177, the second group of upper select gates 117B may be defined between the leftmost second slot structure 175L and the associated dielectric structure 177 and a middle second slot structure 175M and associated dielectric structure 177, the third group of upper select gates 117C may be defined between the middle second slot structure 175M and the associated dielectric structure 177 and a rightmost second slot structure 175R and an associated dielectric structure 177, and the fourth group of upper select gates 117D may be defined between the rightmost second slot structure 175R and an associated dielectric structure 177 and a rightmost slot structure 157R and an associated dielectric structure 156. Although only four groups of upper select gates are described, each block 174 of the stack structure 152 may include fewer or greater numbers of groups of upper select gates. For example, each block 174 may include six, eight, ten, or more groups of upper select gates.

With collective reference to FIG. 1C and FIG. 1D, as noted above, the microelectronic device structure 100 may further include support pillar structures 151 comprising a first material 153 vertically extending through the stack structure 152 and to the source tier 154 and a liner material 155 on sidewalls of the first material 153. The liner material 155 may substantially surround (e.g., substantially horizontally and vertically cover) sidewalls of the first material 153.

The first material 153 may be formed of and include at least one conductive material, such as one or more of the conductive materials described above. In some embodiments, the first material 153 of each of the support pillar structures 151 has substantially the same material composition. In other embodiments, the first material 153 is formed of and includes an insulative material. In some such embodiments, the first material 153 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first material 153 comprises Sift. In some embodiments, such as where the first material 153 comprises an insulative material, the microelectronic device structure 100 may not include the liner material 155 on sidewalls of the first material 153 and the support pillar structures 151 may comprise only the first material 153 (e.g., the insulative material).

The support pillar structures 151 may each individually exhibit a desired geometric configuration (e.g., dimensions and shape) and spacing. The geometric configurations and spacing of the support pillar structures 151 may be selected at least partially based on the configurations and positions of other components (e.g., the steps 111 of the staircase structure(s) 110, conductive contact structures to be formed in contact with the steps 111 of the staircase structure(s) 110, the source tier 154) of the microelectronic device structure 100. For example, the support pillar structures 151 may each individually have a geometric configuration and spacing permitting the support pillar structure 151 to vertically extend (e.g., in the Z-direction) through the stack structure 152 and physically contact (e.g., land on) a structure of the source tier 154 to facilitate a predetermined function (e.g., an electrical interconnection function, a support function) of the support pillar structure 151. In other embodiments, the support pillar structures 151 do not include an electrical interconnection function and serve primarily (e.g., only) a support function. Each of the support pillar structures 151 may exhibit substantially the same geometric configuration (e.g., the same dimensions and the same shape) and horizontal spacing (e.g., in the X-direction) as each of the other support pillar structures 151, or at least some of the support pillar structures 151 may exhibit a different geometric configuration (e.g., one or more different dimensions, a different shape) and/or different horizontal spacing than at least some other of the support pillar structures 151. In some embodiments, the support pillar structures 151 are at least partially uniformly spaced in the X-direction and in the Y-direction. In some embodiments, the support pillar structures 151 are arranged in columns extending in the X-direction and in rows extending in the Y-direction between the first slot structures 157. In other embodiments, the support pillar structures 151 are at least partially non-uniformly spaced in the X-direction.

The support pillar structures 151 may serve as support structures during and/or after the formation of one or more components of the microelectronic device structure 100. For example, the support pillar structures 151 may serve as support structures for the formation of the conductive structures 164 during replacement of sacrificial structures with conductive structures 164, as described above with reference to the "replacement gate" or "gate last" processing acts. The support pillar structures 151 may impede (e.g., prevent) tier collapse during the selective removal of the sacrificial structures.

The liner material 155 may be horizontally interposed between each of the first materials 153 of the support pillar structures 151 and the tiers 168 (including the insulative structures 162 and the conductive structures 164 thereof) of the stack structure 152. The liner material 155 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner material 155 comprises $SiO_2$. In some embodiments, the liner material 155 has a different material composition as the insulative material 176. In other embodiments, the liner material 155 has the same material composition as the insulative material 176. In some embodiments, the liner material 155 comprises a material composition that is not substantially removed responsive to exposure to etch chemistries formulated and configured to remove silicon nitride.

Figure 2A:
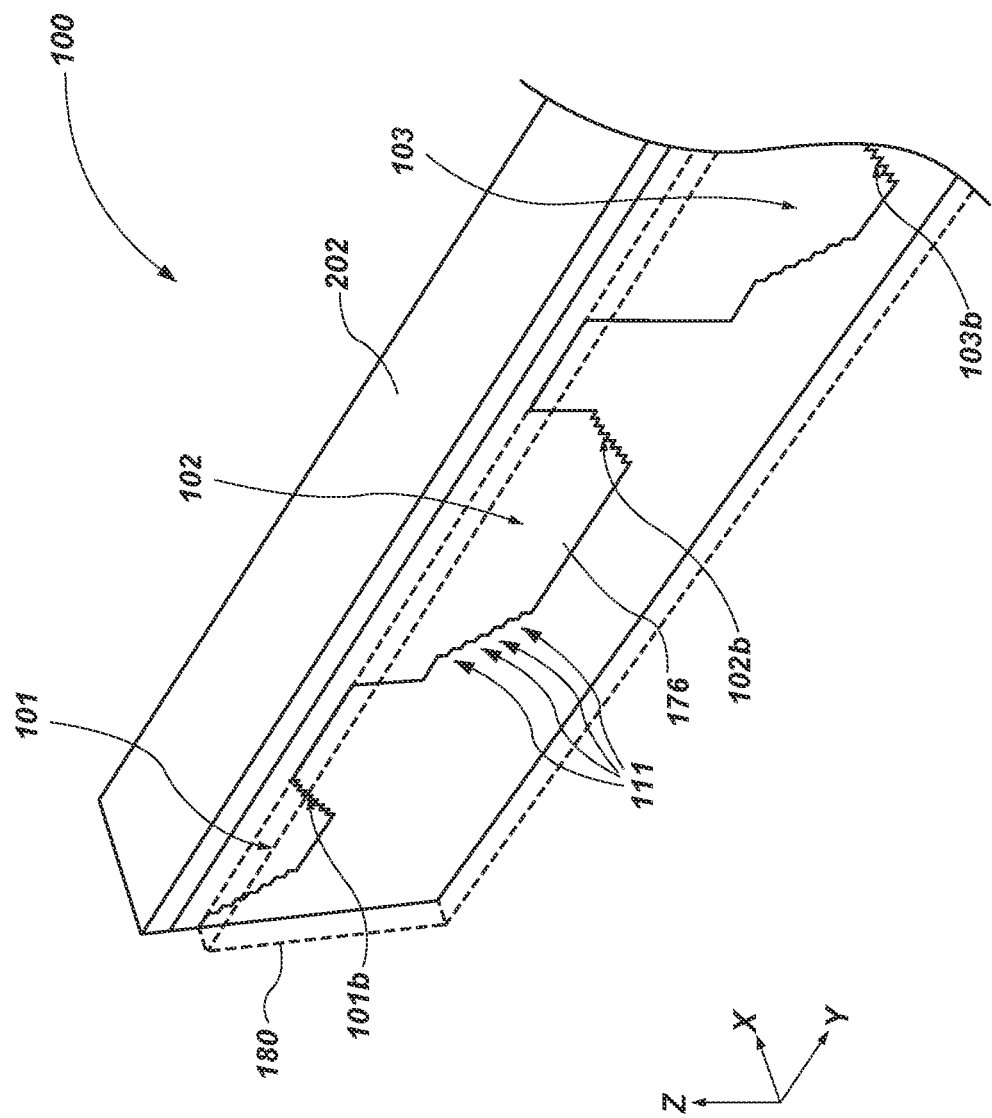
FIGS. 2A-2C are various views of the microelectronic device of FIGS. 1A-1D at another stage of the method of forming the microelectronic device.
Figure 2B:
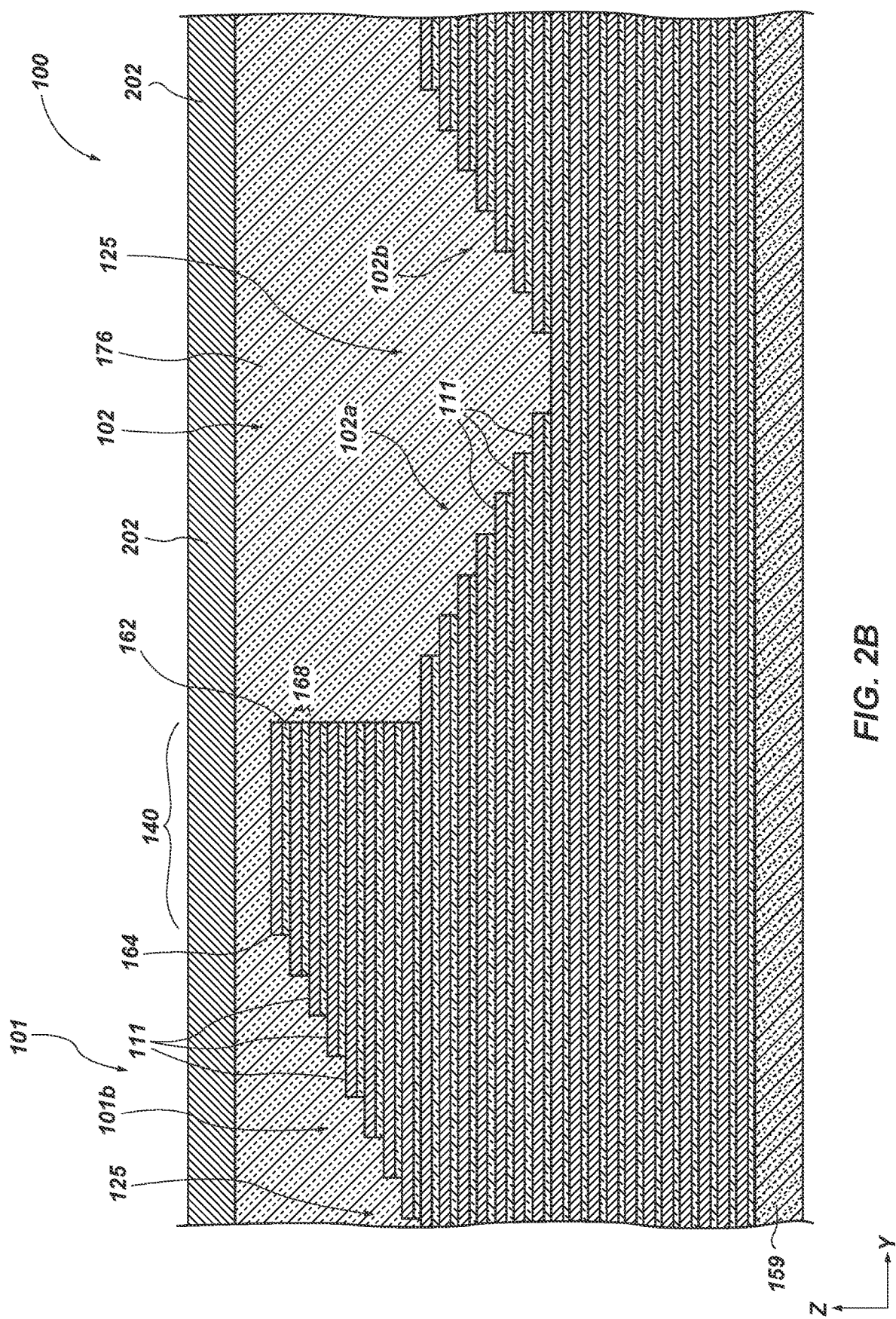
Figure 2C:
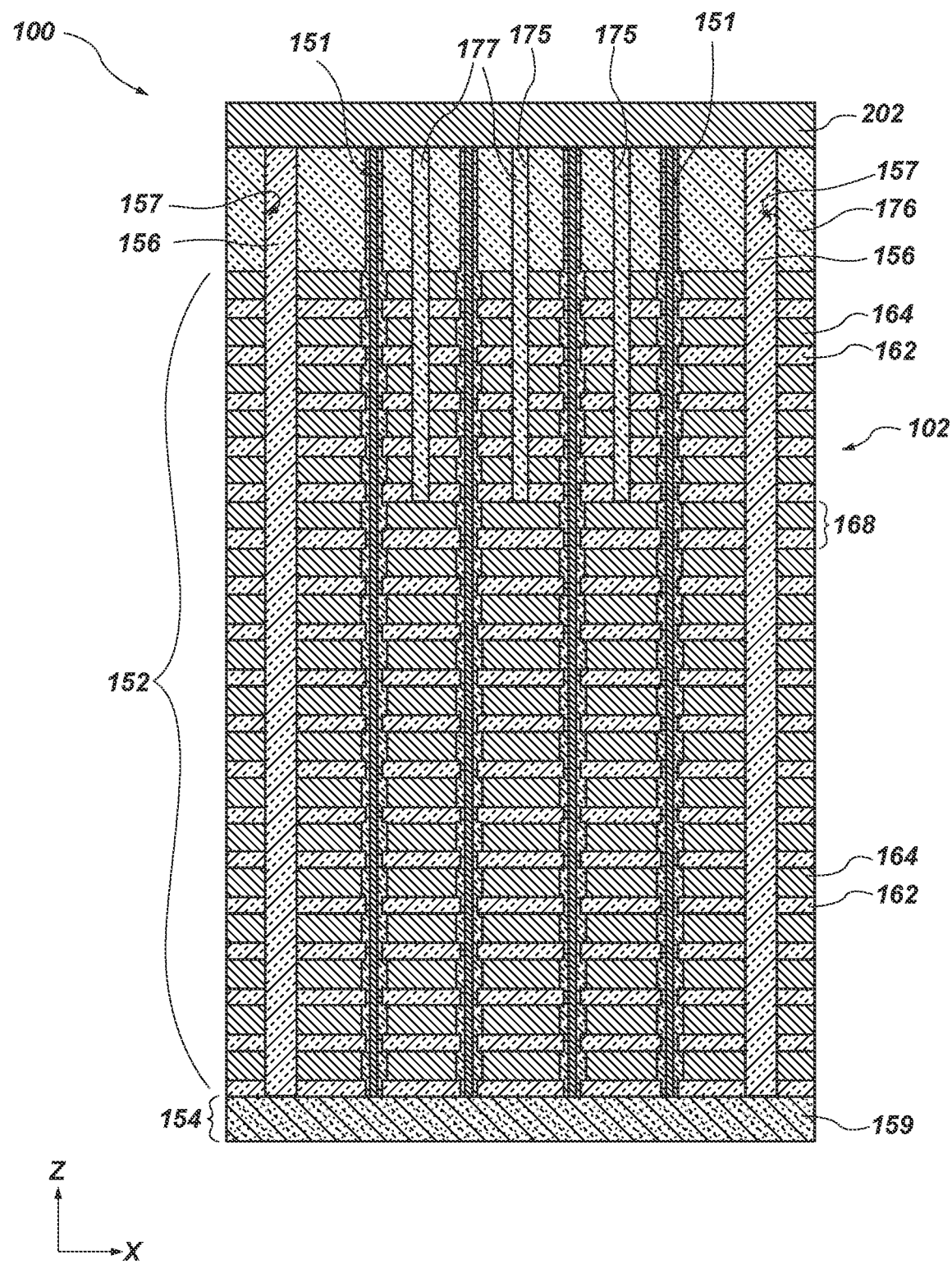

Referring next to FIGS. 2A-2C, a mask structure 202 may be formed over the insulative material 176 of the microelectronic device structure 100. Each of FIGS. 2B and 2C represent a "slice" of the microelectronic device structure 100 of FIG. 2A such that elements of the microelectronic device structure 100 in the foreground and the background may not be depicted. In some embodiments, the mask structure 202 may at least substantially cover an upper surface of the insulative material 176. The mask structure 202 may be formed of and include at least one material (e.g., at least one hard mask material) suitable for use as an etch mask to pattern portions of the stack structure 152 (e.g., portions of the tiers 168, including portions of the insulative structures 162, the conductive structures 164, the support pillar structures 151, and dielectric structures 177) to form apertures (e.g., openings, vias, trenches) vertically extending (e.g., in the Z-direction) through portions of the stack structure 152, as described in further detail below. By way of non-limiting example, the mask structure 202 may be formed of and include one or more hard mask materials having etch selectivity relative to one or more materials of the stack structure 152. In some embodiments, the mask structure 202 comprises one or more of amorphous carbon and doped amorphous carbon (e.g., boron-doped amorphous carbon, such as boron-doped amorphous carbon comprising at least 1 weight percent (wt %) boron and at least 20 wt % carbon, such as between about 1 wt % boron and about 40 wt % boron, and between about 99 wt % carbon and about 60 wt % carbon). In additional embodiments, the mask structure 202 may include one or more of titanium, TiN, or TaN (e.g., a hard mask). In other embodiments, the mask structure 202 is a dielectric material. For example, the hard mask material may include one or more of the dielectric materials described above. The mask structure 202 may be homogeneous (e.g., may include only one material layer), or may be heterogeneous (e.g., may include a stack exhibiting at least two different material layers). In addition, the mask structure 202 may exhibit any thickness permitting desired patterning of the stack structure 152 using mask structure 202, such as a thickness within a range of from about 1 nanometer (nm) to about 1000 nm.

In additional embodiments, the mask structure 202 may include a photoresist structure. The photoresist structure may be formed of and include a photoresist material, such as a positive tone photoresist material, or a negative tone photoresist material. Suitable photoresist materials (e.g., positive tone photoresist materials, negative tone photoresist materials) are known in the art, and are, therefore, not described in detail herein. The photoresist structure may, for example, be compatible with 13.7 nm, 157 nm, 193 nm, 248 nm, or 365 nm wavelength systems; with 193 nm wavelength immersion systems; and/or with electron beam lithographic systems.

In one or more embodiments, the mask structure 202 may be formed by way of one or more of ALD, CVD, PVD, LPCVD, PECVD, another deposition method, or combinations thereof.

Figure 3A:
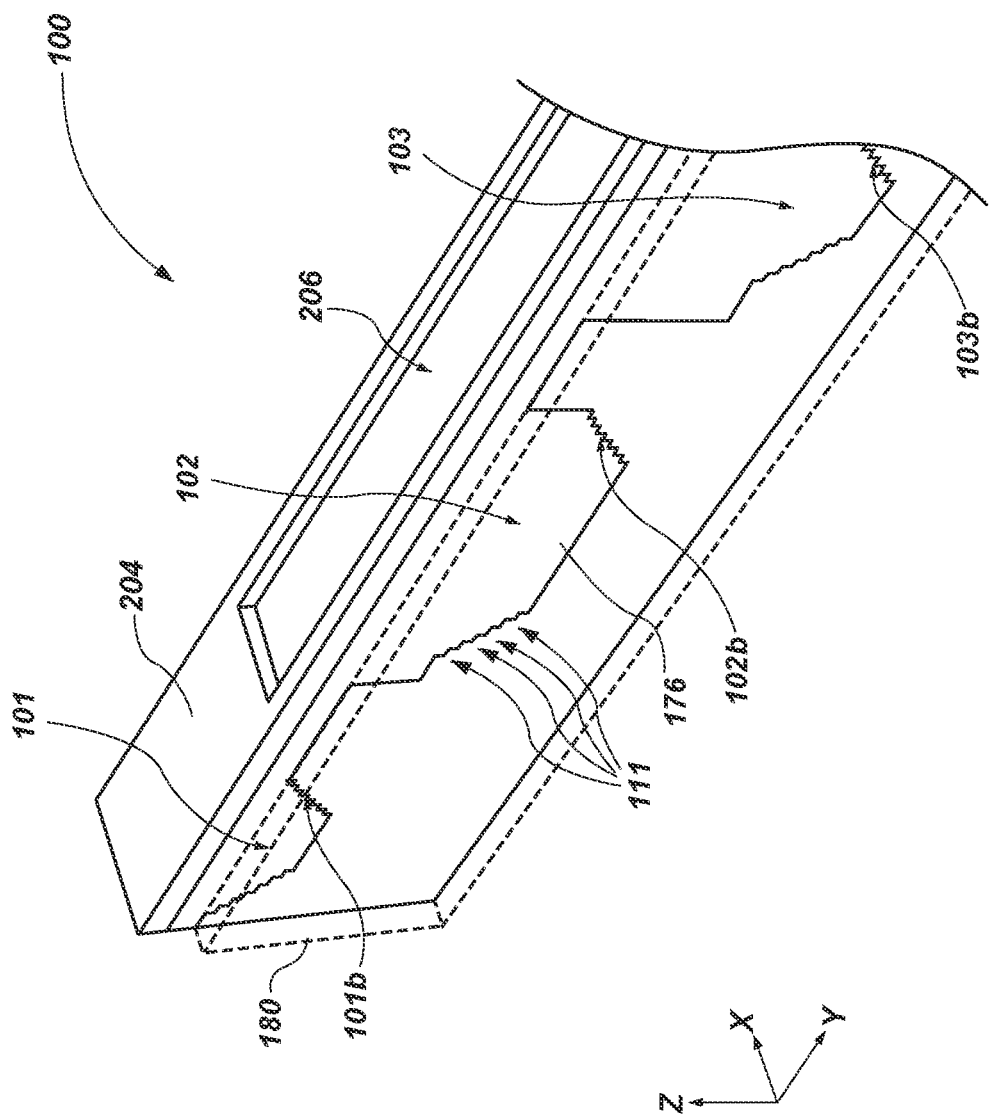
FIGS. 3A-3C are various views of the microelectronic device of FIGS. 1A-1D at another stage of the method of forming the microelectronic device.
Figure 3B:
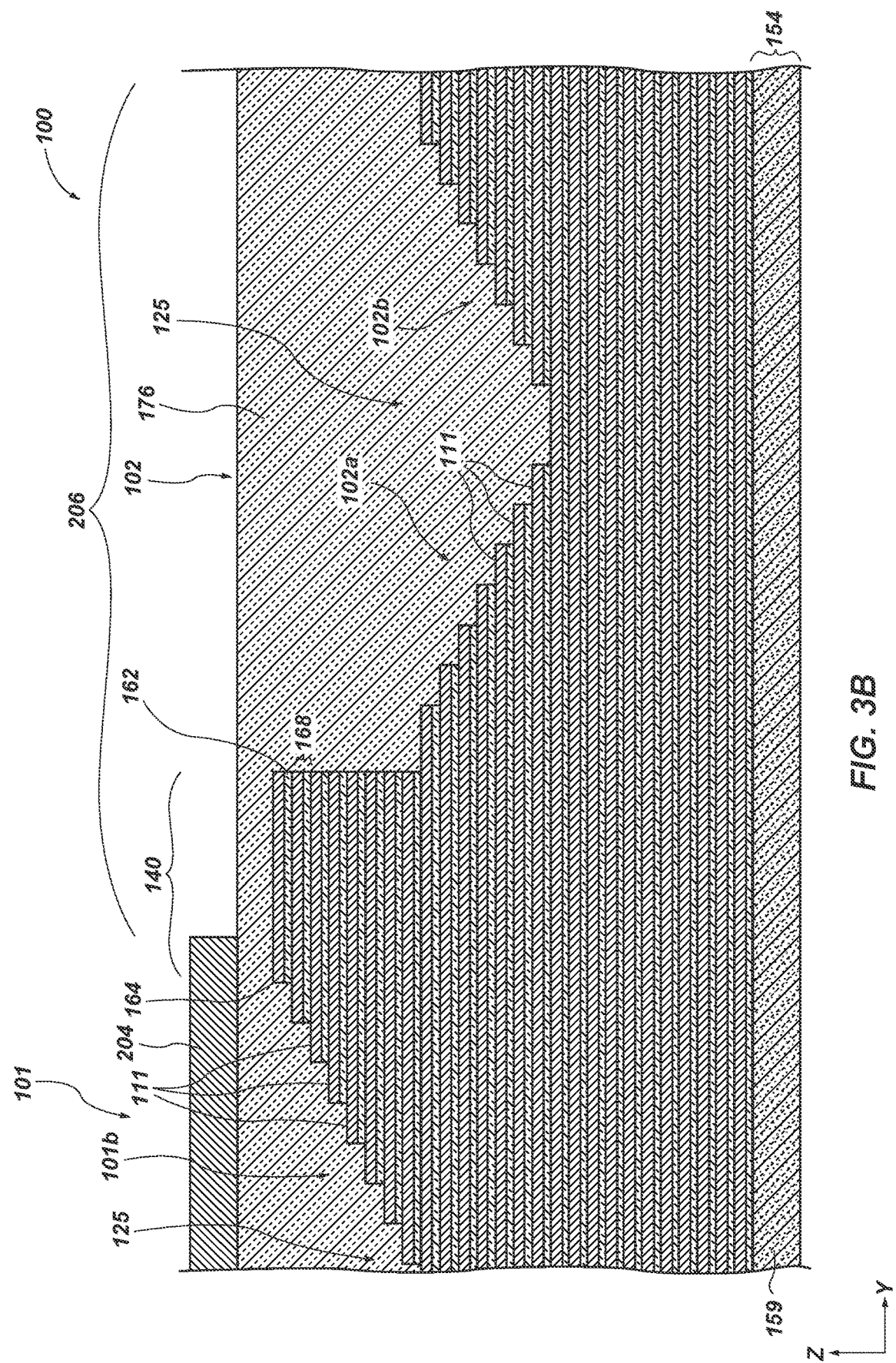
Figure 3C:
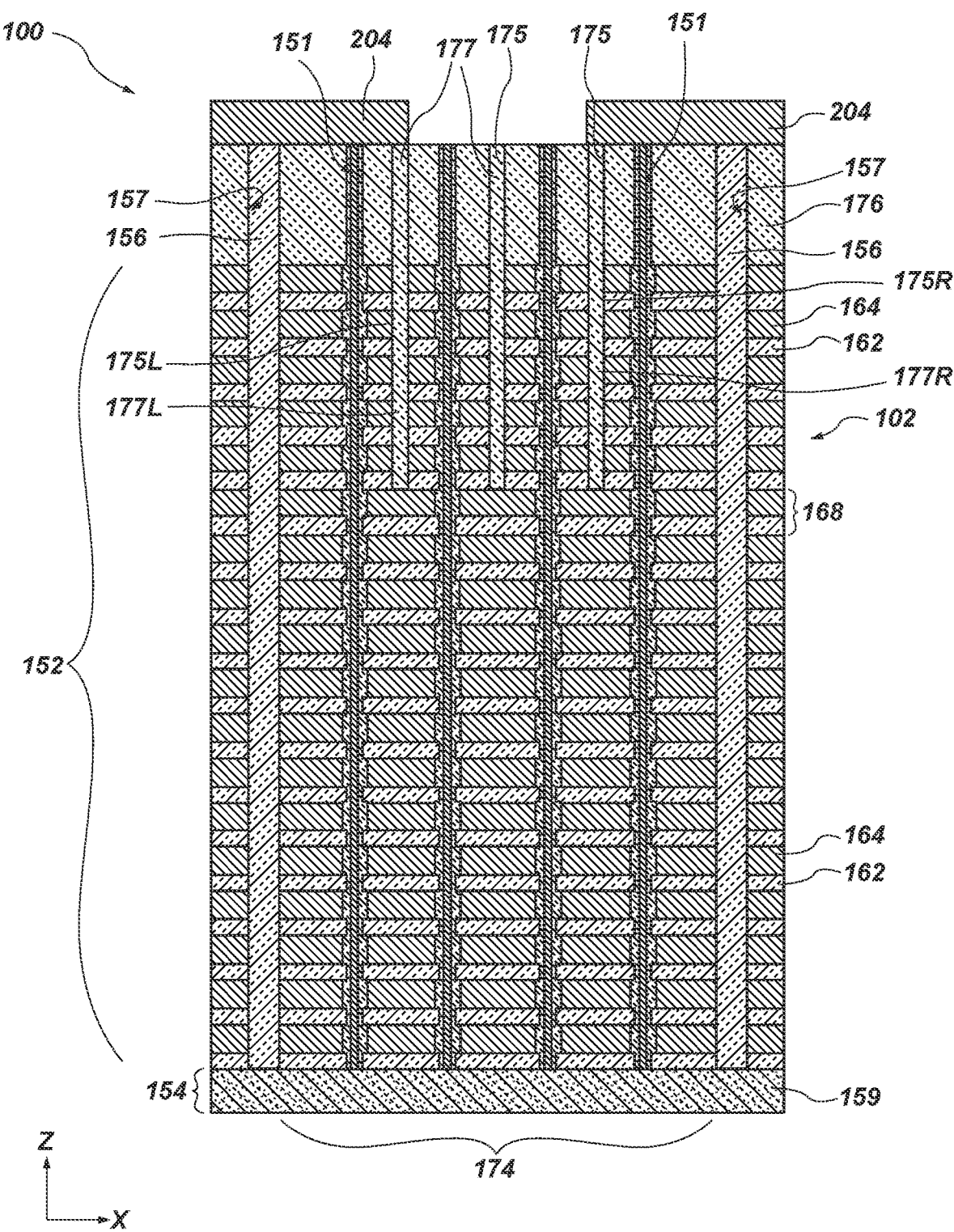

Referring next to FIGS. 3A-3C, portions of the mask structure 202 may be removed (e.g., etched) to form a patterned mask structure 204 including elongated openings 206 (e.g., apertures, vias) vertically extending (e.g., extending in the Z-direction) therethrough. Each of FIGS. 3B and 3C represent a "slice" of the microelectronic device structure 100 of FIG. 3A such that elements of the microelectronic device structure 100 in the foreground and the background may not be depicted. The elongated openings 206 may be formed to exhibit a desired horizontal cross-sectional shape and desired horizontal dimensions (e.g., width, length). In some embodiments, each of the elongated openings 206 is formed to exhibit an oblong horizontal cross-sectional shape (e.g., a rectangular cross-sectional shape). A horizontal dimension (e.g., width) of each of the elongated openings 206 in a first horizontal direction (e.g., the X-direction) may be less than another horizontal dimension (e.g., length) of the elongated opening 206 in a second horizontal direction (e.g., a direction orthogonal to the X-direction (e.g., a Y-direction)).

As shown in FIGS. 3B and 3C, the elongated openings 206 may vertically extend (e.g., in the Z-direction) completely through the patterned mask structure 204, from an upper surface of the patterned mask structure 204 to an upper surface of the stack structure 152 (e.g., an upper surface of the insulative material 176 of the stack structure 152). Additionally, the elongated openings 206 may extend in the Y-direction over portions of the microelectronic device structure 100 including lower stadium structures (e.g., the second stadium structure 102, the third stadium structure 103, and the fourth stadium structure 104). For example, the elongated openings 206 may extend over portions of the microelectronic device structure 100 including lower select gates (e.g., an SGS) and middle tier select gates.

Referring specifically to FIG. 3B, the elongated openings 206 may horizontally extend in the Y-direction from a portion of the microelectronic device structure 100 including the lower stadium structures to and over at least a portion of a crest region 140 formed between an uppermost stadium structure (e.g., the first stadium structure 101) and a neighboring, relatively vertically lower stadium structure (e.g., the second stadium structure 102) of the microelectronic device structure 100. Furthermore, in some embodiments, the elongated openings 206 extend over (e.g., overlap horizontally with (e.g., in a vertical direction with)) a portion of the uppermost stadium structure (e.g., the first stadium structure 101) within which the second slot structures 175 and dielectric structures 177 are formed, as shown in FIG. 3C. In particular, the elongated openings 206 may overlap horizontally with (e.g., in a vertical direction with) portions of the second slot structures 175 and the dielectric structures. For example, the elongated openings 206 may extend over at least a portion of an uppermost step of the uppermost stadium structure (e.g., the first stadium structure 101).

A geometric configuration (e.g., shape, dimensions), horizontal position (e.g., in the X-direction and in the Y-direction), and horizontal spacing of each of the elongated openings 206 in the patterned mask structure 204 at least partially depend on the geometric configuration, horizontal position, and horizontal spacing of trenches to ultimately be formed in the stack structure 152 using the patterned mask structure 204, as described in further detail below in regard to FIGS. 4A-4C. In turn, the geometric configuration, horizontal position, and horizontal spacing of each of the apertures to be formed in the stack structure 152 may at least partially depend on geometric configurations, horizontal positions, and horizontal spacing of structures (e.g., dielectric structures, electrically conductive structures, and insulative structures) of the stack structure 152, as also described in further detail below.

In some embodiments, the microelectronic device structure 100 may include an elongated opening 206 for each block 174 (FIG. 1D) of the stack structure 152. Furthermore, each elongated opening 206 may have a width in the X-direction that is substantially the same as a distance (in the X-direction) between a leftmost dielectric structure 177L (e.g., the dielectric structure 177 within a leftmost second slot structure 175L) and a rightmost dielectric structure 177R (e.g., the dielectric structure 177 within a rightmost second slot structure 175R) of a given block 174.

Additionally, referring still to FIG. 3C, a surface of the patterned mask structure 204 defining a leftmost boundary of a given elongated opening 206 in the X-direction may be at least substantially coplanar to surfaces of the insulative material 176, the insulative structures 162, and the conductive structures 164 defining a boundary (e.g., a major surface) of the leftmost second slot structure 175L. For example, the surface of the patterned mask structure 204 defining the leftmost boundary of the given elongated opening 206 may be coplanar with either a leftmost or a rightmost boundary of the leftmost dielectric structure 177L. In other embodiments, the surface of the patterned mask structure 204 defining the leftmost boundary of the given elongated opening 206 may be generally aligned in a vertical direction with a portion of the leftmost dielectric structure 177L. Furthermore, a surface of the patterned mask structure 204 defining a rightmost boundary of the given elongated opening 206 in the X-direction may be at least substantially coplanar to surfaces of the insulative material 176, the insulative structures 162, and the conductive structures 164 defining a boundary (e.g., a major surface) of the rightmost second slot structure 175R. For example, the surface of the patterned mask structure 204 defining the rightmost boundary of the given elongated opening 206 may be coplanar with either a leftmost or a rightmost boundary of the rightmost dielectric structure 177R. In other embodiments, the surface of the patterned mask structure 204 defining the rightmost boundary of the given elongated opening 206 may be generally aligned in a vertical direction with a portion of the rightmost dielectric structure 177R. As will be described in greater detail below, the elongated openings 206 defined by the patterned mask structure 204 may permit removal of portions of the stack structure 152 between the leftmost dielectric structure 177L and the rightmost dielectric structure 177R (e.g., between the first group of drain select gates 117A and the fourth group of drain select gates 117D).

Figure 4A:
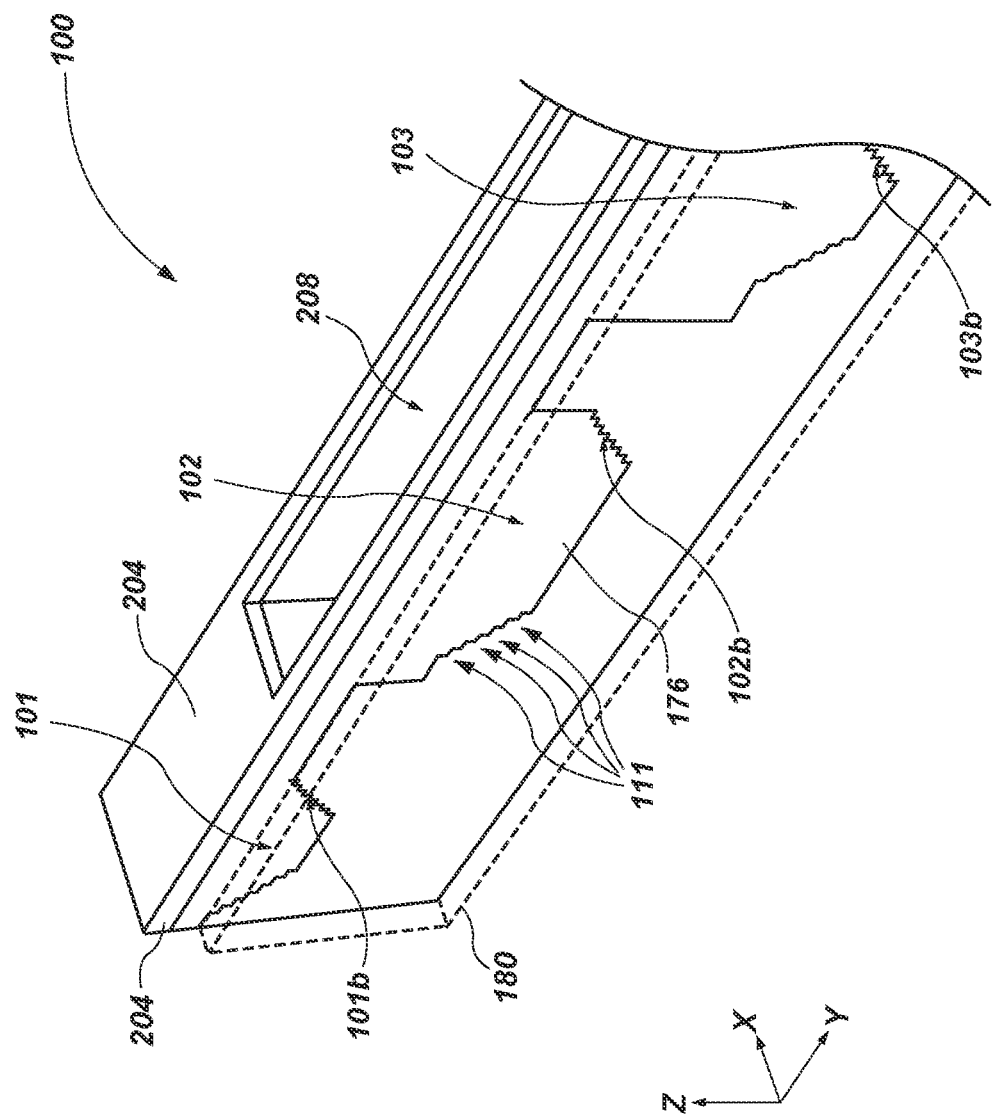
FIGS. 4A-4C are various views of the microelectronic device of FIGS. 1A-1D at another stage of the method of forming the microelectronic device.
Figure 4B:
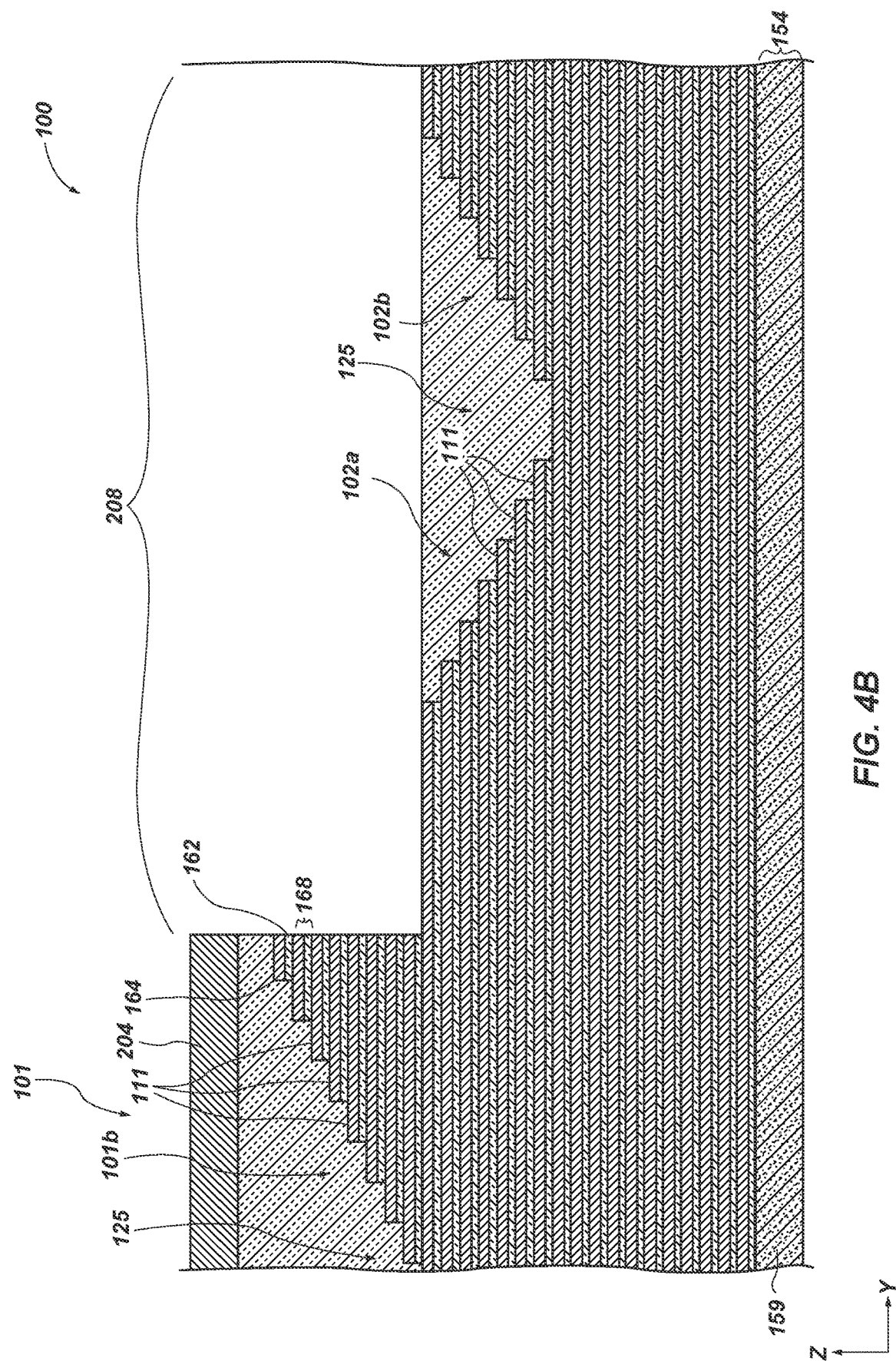
Figure 4C:
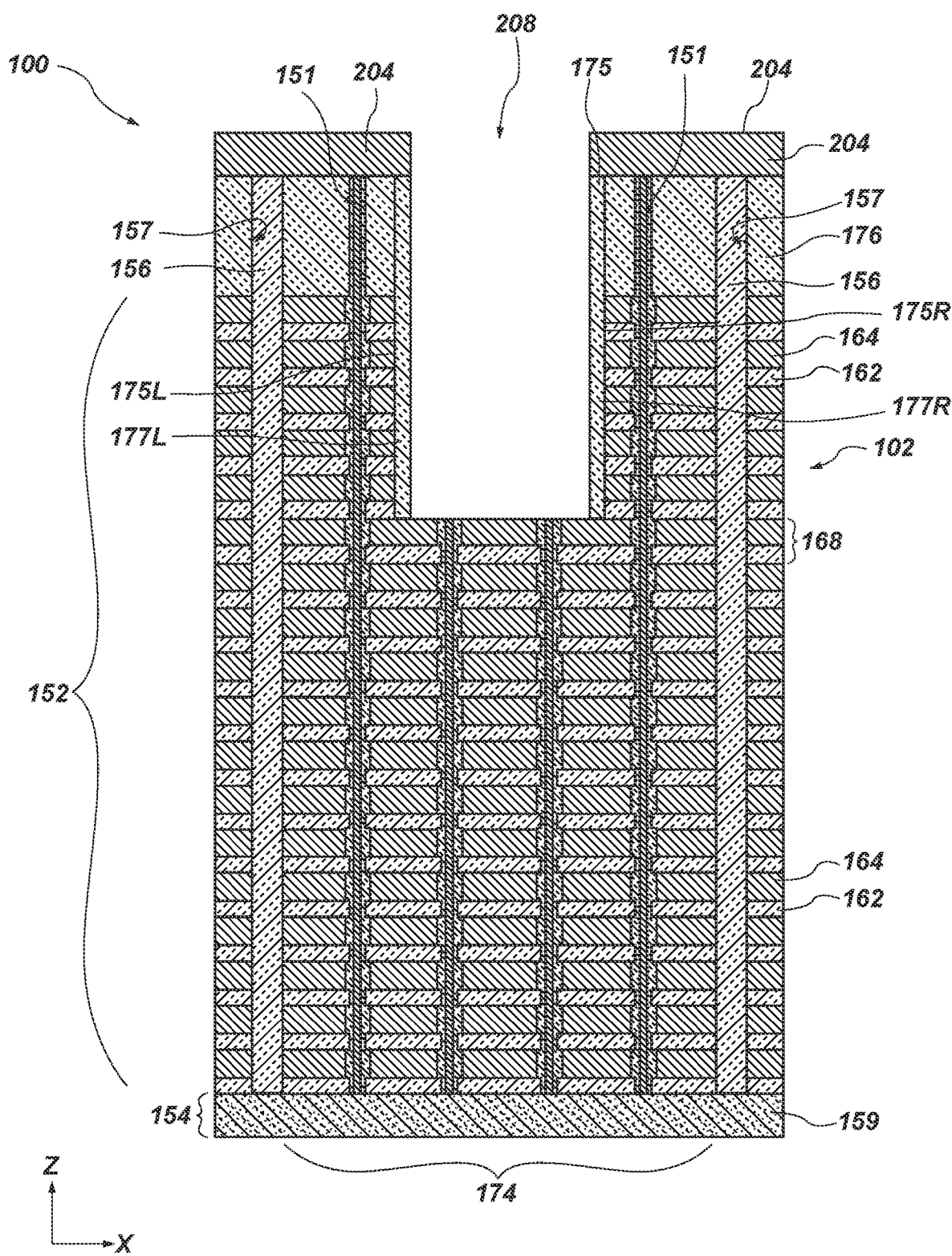

With reference to FIGS. 4A-4C, portions of the stack structure 152 may be removed through the elongated openings 206 to form trenches 208 (e.g., slots, slits). Each of FIGS. 4B and 4C represent a "slice" of the microelectronic device structure 100 of FIG. 4A such that elements of the microelectronic device structure 100 in the foreground and the background may not be depicted. Due at least partially to the horizontal cross-sectional shape of the elongated openings, the trenches 208 may be formed to exhibit a desired horizontal cross-sectional shape and desired horizontal dimensions (e.g., width, length). In some embodiments, each of the trenches 208 is formed to exhibit an oblong horizontal cross-sectional shape (e.g., a rectangular cross-sectional shape). A horizontal dimension (e.g., width) of each of the trenches 208 in a first horizontal direction (e.g., the X-direction) may be less than another horizontal dimension (e.g., length) of the trench 122 in a second horizontal direction (e.g., a direction orthogonal to the X-direction (e.g., a Y-direction)).

The trenches 208 may vertically extend (e.g., in the Z-direction) through the insulative material 176, upper tiers 168 (e.g., upper insulative structures 162 and upper conductive structures 164), portions of support pillar structures 151, and at least portions of one or more dielectric structures 177 of the stack structure 152. The trenches 208 may disrupt (e.g., terminate) the horizontal continuity of the upper insulative structures 162 and the upper conductive structures 164 of the upper tiers 168 of the stack structure 152. The trenches 208 may vertically extend through a portion of the stack structure 152 forming upper select gates (SGDs) of the microelectronic device structure. In particular, the trenches 208 may extend vertically through at least a portion of the stack structure 152 forming the first stadium structure 101. In some embodiments, the trenches 208 may vertically terminate (e.g., end) at upper surfaces of conductive structure(s) 164 of a tier 168 of the stack structure 152 that forms a portion (e.g., an upper step) of the second stadium structure 102. For example, lower vertical boundaries of the trenches 208 may be substantially coplanar with upper surfaces of conductive structures 164 of the tier 168 of the stack structure 152 that forms the upper step of the second stadium structure 102, as depicted in FIG. 4B. In other embodiments, the trenches 208 may extend at least partially into the conductive structures 164 of the tier 168 of the stack structure 152 and may terminate within the vertical boundaries of the electrically conductive structures 164. In some embodiments, each of the trenches 208 extends to substantially the same vertical depth as each other of the trenches 208.

In some embodiments, a width of each of the trenches 208 may be substantially the same as the width of a respective elongated opening 206 described above. In particular, each of the trenches 208 may have a width in the X-direction that is substantially the same as a distance (in the X-direction) between a leftmost dielectric structure 177L (e.g., the dielectric structure 177 within a leftmost second slot structure 175L) and a rightmost dielectric structure 177R (e.g., the dielectric structure 177 within a rightmost second slot structure 175R) of a respective block 174. Accordingly, formation of the trenches 208 may remove portions of the second and third groups of select gates 117B and 117C between the leftmost dielectric structure 177L and the rightmost dielectric structure 177R (e.g., portions of the second and third groups of select gates 117B and 117C between the first group of drain select gates 117A and the fourth group of drain select gates 117D) and within the crest region 140 (FIG. 1A) of the microelectronic device structure 100 between the first stadium structure 101 and the second stadium structure. As a result, the trenches 208 may at least partially horizontally partition (e.g., segregate) the first group of drain select gates 117A from the fourth group of drain select gates 117D within the crest region 140 (FIG. 1A) between the first stadium structure 101 and the second stadium structure 102. Furthermore, as noted above, the trenches 208 may partially overlap with the dielectric structures 177 and their associated second slot structures 175 in the Y direction. Furthermore, in some embodiments, the trenches 208 may not extend past a first step 111 (e.g., an uppermost step) of the first stadium structure 101 in the Y-direction.

The trenches 208 may be formed using conventional processes, such as conventional material removal processes (e.g., conventional etching processes, such as conventional dry etching processes) and conventional processing equipment, which are not described in detail herein. By way of non-limiting example, the insulative material 176, the upper tiers 168 (e.g., upper insulative structures 162 and upper conductive structures 164), portions of support pillar structures 151, and at least a portion of one or more dielectric structures 177 of the stack structure 152 may be subjected to anisotropic etching (e.g., anisotropic dry etching, such as one or more of reactive ion etching (RIE), deep RIE, plasma etching, reactive ion beam etching, and chemically assisted ion beam etching or anisotropic wet etching) to form the trenches 208.

As is described in greater detail below, the trenches 208 may be advantageous over other manners of segregating a first group of upper select gates (e.g., the first group of upper selects gates 117A) from a fourth group of upper select gates (e.g., the fourth group of upper selects gates 117D) of a microelectronic device structure (e.g., the microelectronic device structure 100). For example, as noted above, due to the elevated bridge portions 180, 182 (FIGS. 1A and 1D), shorting paths between the first group of upper select gates 117A and the fourth group of upper select gates 117D may exist prior to the formation of the trenches 208, and the trenches 208 may disrupt (e.g., remove) theses shorting paths. In particular, in some embodiments, the trenches 208 segregate portions of the first group of upper select gates 117A from the fourth group of upper select gates 117D within the crest region 140 (FIG. 1A) between the first stadium structure 101 and the second stadium structure 102. As a result, the trenches 208 may prevent upper select gates within the first group of drain select gates 117A from shorting (e.g., leaking current and causing short circuits) with upper select gates within the fourth group of drain select gates 117D through and across the crest region 140 (FIG. 1A) between the first stadium structure 101 and the second stadium structure 102.

Figure 5A:
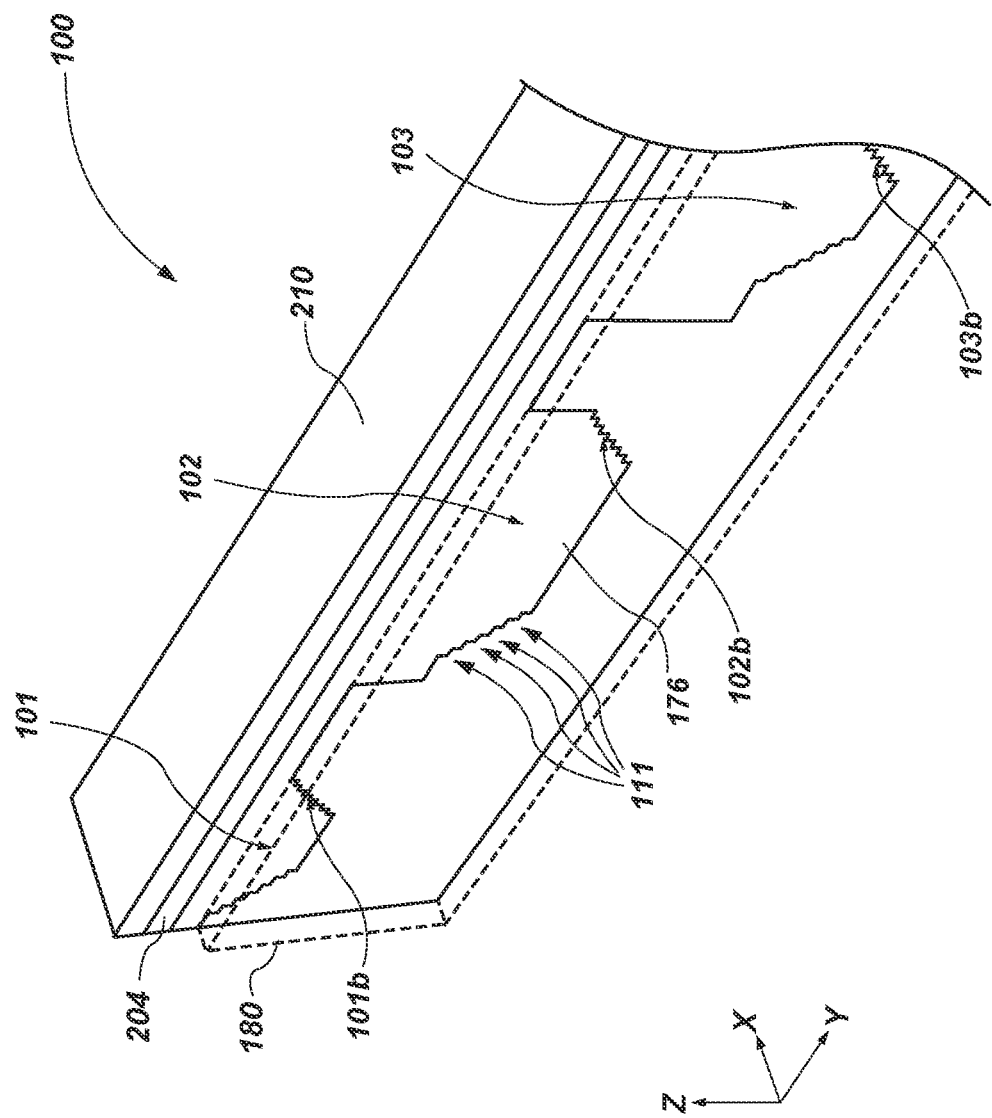
FIGS. 5A-5C are various views of the microelectronic device of FIGS. 1A-1D at another stage of the method of forming the microelectronic device.
Figure 5B:
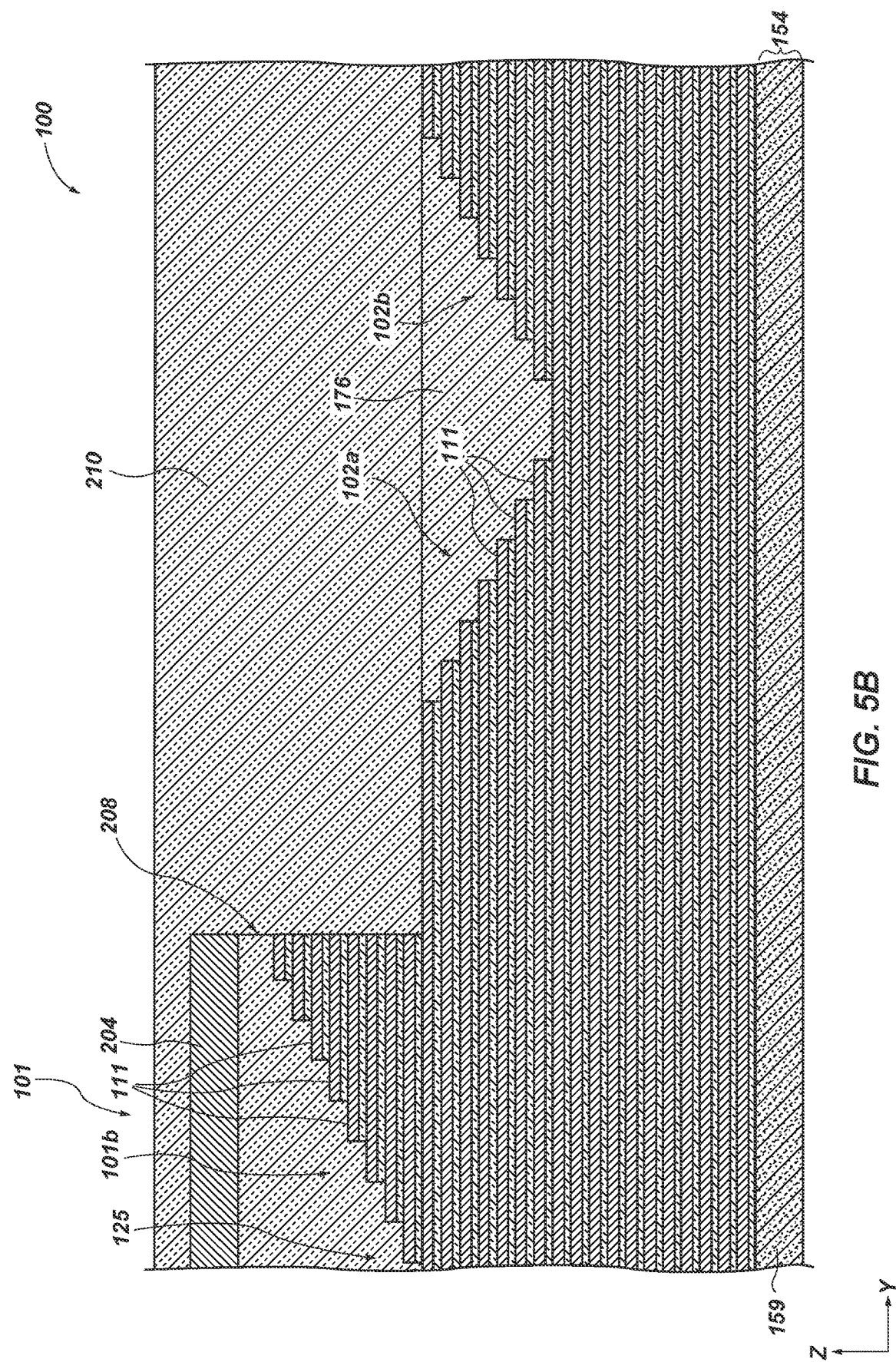
Figure 5C:
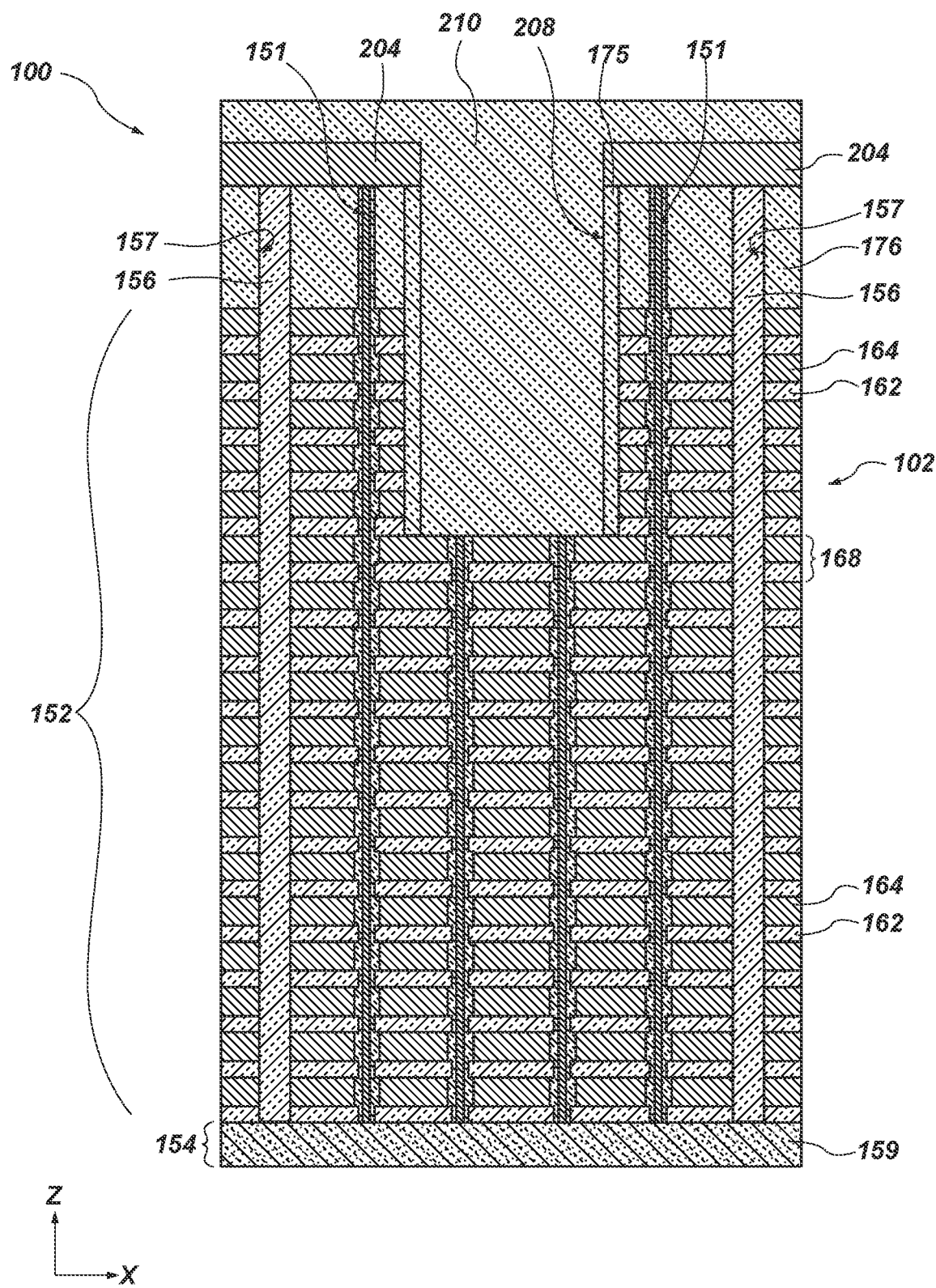

Referring to FIGS. 5A-5C, a dielectric material 210 may be formed (e.g., deposited) within the trenches 208 and over the patterned mask structure 204. Each of FIGS. 5B and 5C represent a "slice" of the microelectronic device structure 100 of FIG. 5A such that elements of the microelectronic device structure 100 in the foreground and the background may not be depicted. The trenches 208 may be at least substantially filled with dielectric material 210. In some embodiments, the dielectric material 210 comprise a spin-on dielectric material, and may be formed by a spin coating process. In additional embodiments, the dielectric material 210 may be formed using one or more of ALD, CVD, PVD, LPCVD, PECVD, or another deposition method. In some embodiments, the dielectric material 210 is formed of and includes at least one dielectric oxide material. For example, the dielectric material 210 may include one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, $MgO_x$, and a high-aspect-ratio process (HARP) oxide.

Although not explicitly depicted in FIGS. 5A-5C, in some embodiments, portions of the dielectric material 210 and/or portions of the dielectric material 210 and the patterned mask structure 204 on or over the insulative material 176 may be removed, while retaining additional portions of the dielectric material 210 with boundaries of the trenches 208. In some embodiments, the portions of the dielectric material 210 and/or the portions of the dielectric material 210 and the patterned mask structure 204 may be removed by an abrasive planarization process (e.g., a chemical mechanical planarization (CMP) process). In other embodiments, the portions of the dielectric material 210 and/or the portions of the dielectric material 210 and the patterned mask structure 204 may be removed by another suitable technique including, but not limited to, etching (e.g., dry etching, wet etching, vapor etching) or ion milling.

As will be understood by those of ordinary skill in the art, although the microelectronic device structure 100 has been described as having particular structures, the disclosure is not so limited, and the microelectronic device structures 100 may have different geometric configurations and orientations.

Referring to FIG. 1A-5C together, the trenches 208 and the dielectric material 210 filling the trenches 208 may be advantageous over other manners of segregating a first group of upper select gates (e.g., the first group of upper selects gates 117A) from a fourth group of upper select gates (e.g., the fourth group of upper selects gates 117D) a microelectronic device structure (e.g., the microelectronic device structure 100) having segmented staircase structures (e.g., the staircase structures 110), such as segmented upper stadium structures (e.g., the first stadium structures 101). For example, as noted above, due to the elevated bridge portions 180, 182 (FIGS. 1A and 1D) of segmented upper stadium structures, shorting paths between the first group of upper select gates 117A (e.g., a first group of drain select gates) and the fourth group of upper select gates 117D (e.g., a fourth group of drain select gates) may exist within the crest region 140. To mitigate this issue, the trenches 208 and the dielectric material 210 filling the trenches 208 may overlap in the Y-direction with portions of the second slot structures 175 extending through the first stadium structure 101 of the microelectronic device structure 100. As a result, the trenches 208 and the dielectric material 210 filling the trenches 208 extend between the first group of upper select gates 117A and the fourth group of upper select gates 117D within the crest region 140 of the microelectronic device structure 100.

Because the trenches 208 and the dielectric material 210 extend into the crest region 140 between the first stadium structure 101 and the second stadium structure 102 and because the trenches 208 and the dielectric material 210 extend between the first group of upper select gates 117A and the fourth group of upper select gates 117D within the crest region 140, the trenches 208 and the dielectric material 210 physically separate portions of the first group of upper select gates 117A from the fourth group of upper select gates 117D within the crest region 140 (FIG. 1A). As a result, the trenches 208 may remove shorting paths between the first group of upper select gates 117A and the fourth group of upper select gates 117D within the crest region 140. Accordingly, the trenches 208 may prevent gates within the first group of drain select gates 117A from shorting with gates within the fourth group of drain select gates 117D through and across the crest region 140.

Additionally, the trenches 208 and dielectric material 210 described herein are advantageous over forming barriers within the crest region 140 and/or a valley 125 (FIG. 1A) extending horizontally in a direction (e.g., the X-direction) orthogonal to the direction (e.g., the Y-direction) in which the first slot structures 157 extend to prevent shorting across the crest region 140. For example, due to manufacturing limitations, forming barriers and features in the X-direction (e.g., patterning in the X-direction) provide challenges in maintaining critical dimensions, and when critical dimensions of patterning in the X-direction are increased, risks of under etching and over etching are increased. The foregoing manufacturing limitations are not significant concerns when patterning in the Y-direction, as depicted in the FIGS.

Furthermore, forming the trenches 208 and the dielectric material 210 does not require forming relatively small features. Additionally, typical manufacturing processes would not involve significant structural changes within the microelectronic device structure 100 after forming the trenches 208 and the dielectric material 210. Moreover, the forming the trenches 208 and the dielectric material 210 through eight, ten, fifteen, or more tiers 168 of the stack structure 152 may be relatively accurate.

Figure 6:
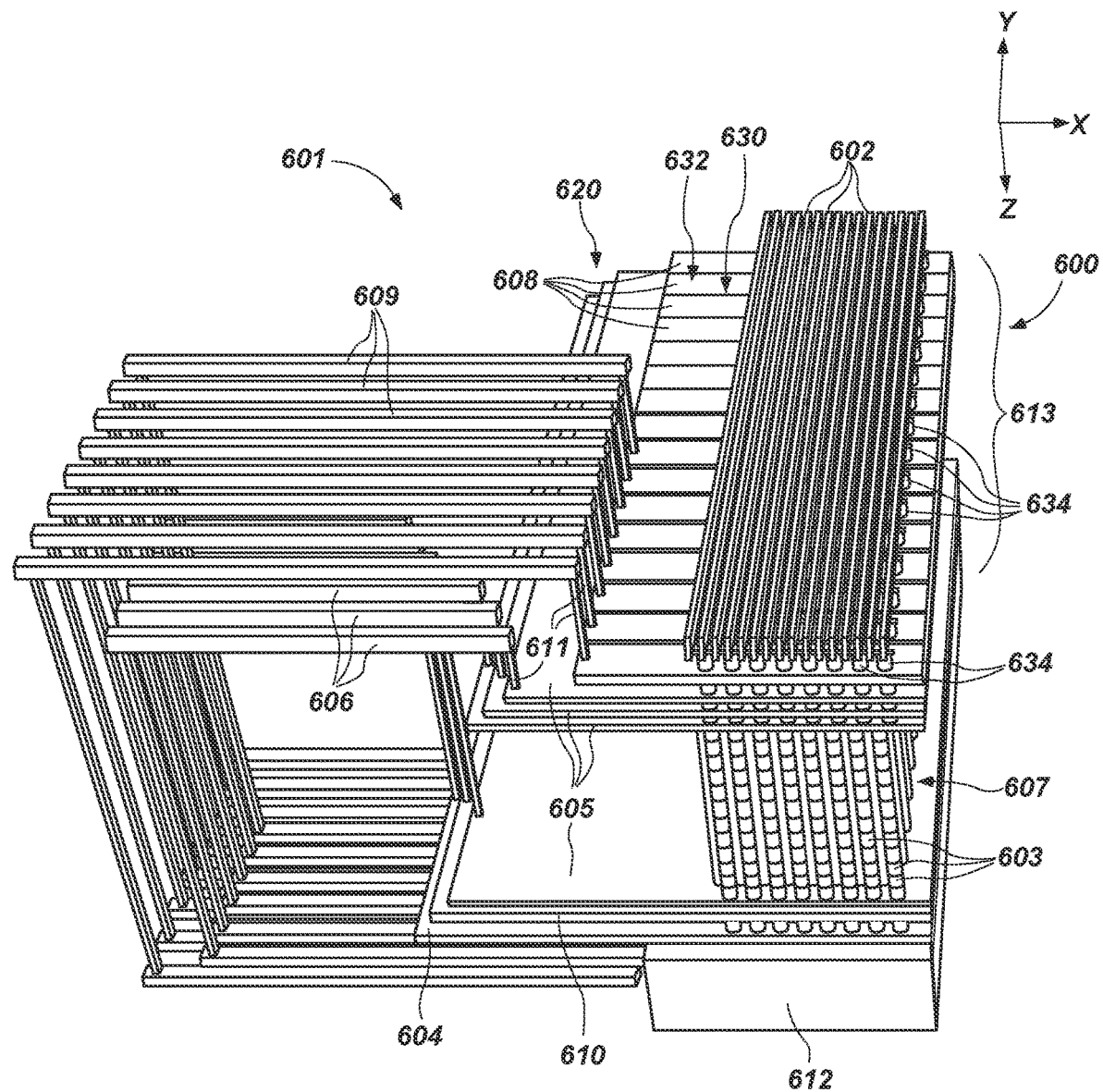
FIG. 6 is a partial cutaway perspective view of a microelectronic device, in accordance with embodiments of the disclosure.

FIG. 6 illustrates a partial cutaway perspective view of a portion of a microelectronic device 601 (e.g., a memory device, such as a dual deck 3D NAND Flash memory device) including a microelectronic device structure 600. The microelectronic device structure 600 may be substantially similar to the microelectronic device structure 100 following the processing stages previously described with reference to FIG. 1A-FIG. 5C. As shown in FIG. 6, the microelectronic device structure 600 may include a stack structure 613 including segmented staircase structures 620 (e.g., the staircase structures 110 (FIGS. 1A-1C)) defining contact regions for connecting access lines 606 to conductive tiers 605 (e.g., conductive layers, conductive plates, such as the conductive structures 164 (FIGS. 1A-5C)). The microelectronic device structure 600 may include vertical strings 607 of memory cells 603 that are coupled to each other in series. The vertical strings 607 may extend vertically (e.g., in the Z-direction) and orthogonally to conductive lines and tiers 605, such as data lines 602, a source tier 604 (e.g., the source structure 159 (e.g., FIGS. 1B and 1C)), the conductive tiers 605, the access lines 606, first select gates 608 (e.g., upper select gates, drain select gates (SGDs)), select lines 609, and a second select gate 610 (e.g., a lower select gate, a source select gate (SGS)). The stack structure 613 may be horizontally divided (e.g., in the Y-direction) into multiple blocks 632 (e.g., blocks 174 (FIG. 1D)) horizontally separated (e.g., in the Y-direction) from one another by slot structures 630 (e.g., first slot structures 157 (FIGS. 1B-1D)).

Vertical conductive contacts 611 may electrically couple components to each other as shown. For example, the select lines 609 may be electrically coupled to the first select gates 608 and the access lines 606 may be electrically coupled to the conductive tiers 605. The microelectronic device 601 may also include a control unit 612 positioned under the memory array, which may include control logic devices configured to control various operations of other features (e.g., the vertical strings 607 of memory cells 603) of the microelectronic device 601. By way of non-limiting example, the control unit 612 may include one or more (e.g., each) of charge pumps (e.g., VCCP charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 612 may be electrically coupled to the data lines 602, the source tier 604, the access lines 606, the first select gates 608, and the second select gates 610, for example. In some embodiments, the control unit 612 includes CMOS (complementary metal-oxide-semiconductor) circuitry. In such embodiments, the control unit 612 may be characterized as having a "CMOS under Array" ("CuA") configuration.

The first select gates 608 may extend horizontally in a first direction (e.g., the X-direction) and may be coupled to respective first groups of vertical strings 607 of memory cells 603 at a first end (e.g., an upper end) of the vertical strings 607. The second select gate 610 may be formed in a substantially planar configuration and may be coupled to the vertical strings 607 at a second, opposite end (e.g., a lower end) of the vertical strings 607 of memory cells 603.

The data lines 602 (e.g., bit lines) may extend horizontally in a second direction (e.g., in the Y-direction) that is at an angle (e.g., perpendicular) to the first direction in which the first select gates 608 extend. The data lines 602 may be coupled to respective second groups of the vertical strings 607 at the first end (e.g., the upper end) of the vertical strings 607. A first group of vertical strings 607 coupled to a respective first select gate 608 may share a particular vertical string 607 with a second group of vertical strings 607 coupled to a respective data line 602. Thus, a particular vertical string 607 may be selected at an intersection of a particular first select gate 608 and a particular data line 602. Accordingly, the first select gates 608 may be used for selecting memory cells 603 of the vertical strings 607 of memory cells 603.

The conductive tiers 605 (e.g., word line plates, such as the conductive structures 164 (FIG. 1C)) may extend in respective horizontal planes. The conductive tiers 605 may be stacked vertically, such that each conductive tier 605 is coupled to all of the vertical strings 607 of memory cells 603, and the vertical strings 607 of the memory cells 603 extend vertically through the stack of conductive tiers 605. The conductive tiers 605 may be coupled to or may form control gates of the memory cells 603 to which the conductive tiers 605 are coupled. Each conductive tier 605 may be coupled to one memory cell 603 of a particular vertical string 607 of memory cells 603.

The staircase structure 620 may be configured to provide electrical connection between the access lines 606 and the tiers 605 through the vertical conductive contacts 611. For example, a particular level of the tiers 605 may be selected through an access line 606 in electrical communication with a respective conductive contact 611 in electrical communication with the particular tier 605.

The data lines 602 may be electrically coupled to the vertical strings 607 through conductive contact structure 634.

As described above, with reference to the microelectronic device structure 100, an insulative material (e.g., the insulative material 176 (FIG. 1B, 1C)) may provide electrical isolation between neighboring conductive contacts 611.

Figure 7:
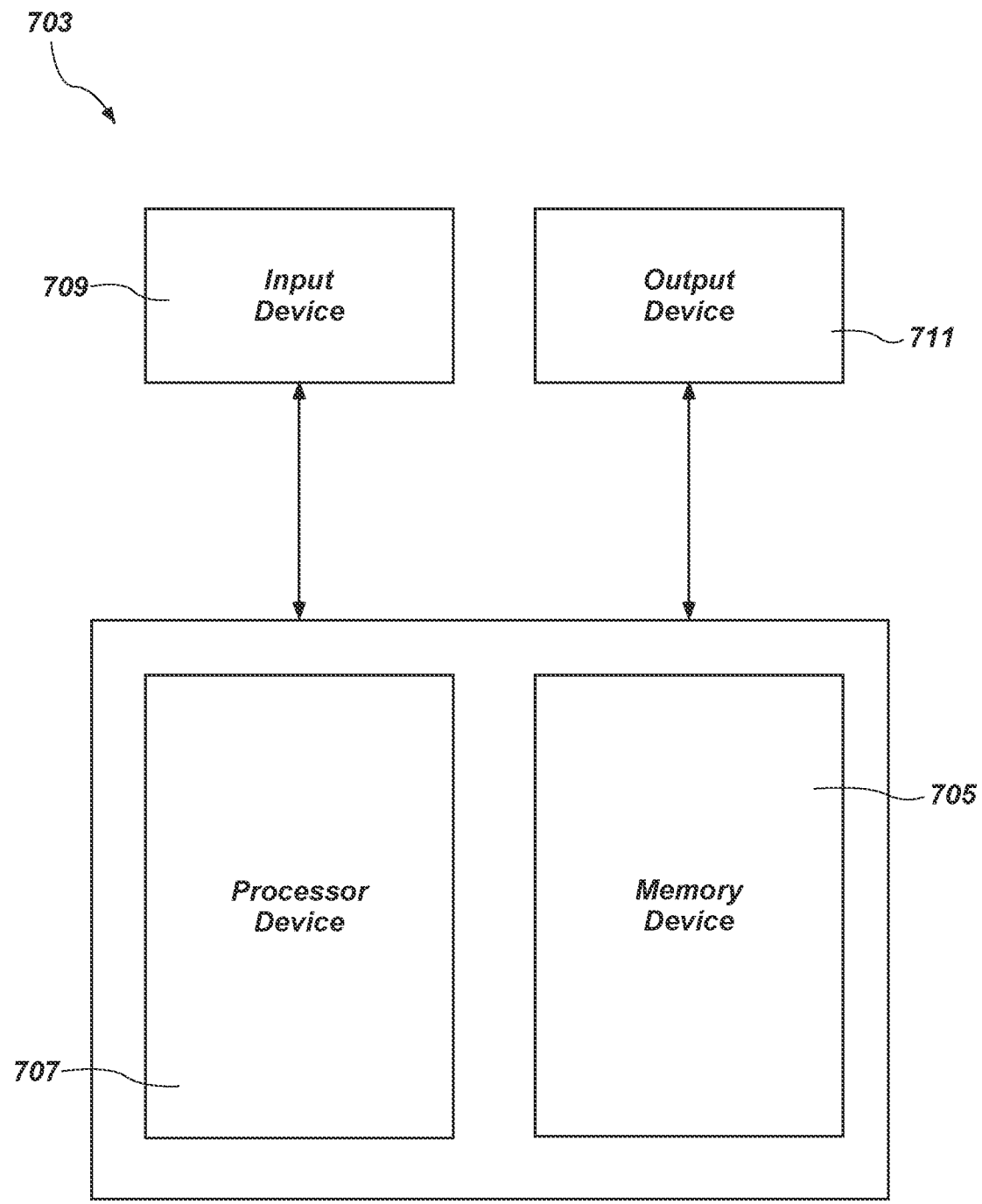
FIG. 7 is a schematic block diagram illustrating an electronic system, in accordance with embodiments of the disclosure.

Microelectronic device structures (e.g., the microelectronic device structure 100 previously described with reference to FIGS. 5A-5C, the microelectronic device structure 600 previously described with reference to FIG. 6) and microelectronic devices (e.g., the microelectronic device 601 previously described with reference to FIG. 6) in accordance with embodiments of the disclosure may be used in embodiments of electronic systems of the disclosure. For example, FIG. 7 is a block diagram of an illustrative electronic system 700 according to embodiments of disclosure. The electronic system 700 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, and/or a navigation device. The electronic system 700 includes at least one memory device 702. The memory device 702 may comprise, for example, an embodiment of one or more of a microelectronic device structure and a microelectronic device previously described herein. The electronic system 700 may further include at least one electronic signal processor device 704 (often referred to as a "microprocessor"). The electronic signal processor device 704 may, optionally, include an embodiment of one or more of a microelectronic device structure and a microelectronic device previously described herein. While the memory device 702 and the electronic signal processor device 704 are depicted as two (2) separate devices in FIG. 7, in additional embodiments, a single (e.g., only one) memory/processor device having the functionalities of the memory device 702 and the electronic signal processor device 704 is included in the electronic system 700. In such embodiments, the memory/processor device may include one or more of a microelectronic device structure and a microelectronic device previously described herein. The electronic system 700 may further include one or more input devices 706 for inputting information into the electronic system 700 by a user, such as, for example, a mouse or other pointing device, a keyboard, a touchpad, a button, or a control panel. The electronic system 700 may further include one or more output devices 708 for outputting information (e.g., visual or audio output) to a user such as, for example, one or more of a monitor, a display, a printer, an audio output jack, and a speaker. In some embodiments, the input device 706 and the output device 708 may comprise a single touchscreen device that can be used both to input information to the electronic system 700 and to output visual information to a user. The input device 706 and the output device 708 may communicate electrically with one or more of the memory device 702 and the electronic signal processor device 704.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure comprising tiers each comprising a conductive structure and a dielectric structure vertically neighboring the conductive structure; trenches vertically extending completely through the stack structure and filled with dielectric material; additional trenches horizontally alternating with the trenches and vertically extending partially through the stack structure, at least one of the additional trenches having non-planar horizontal boundaries and filled with additional dielectric material; a source tier vertically below the stack structure and comprising a source structure and discrete conductive structures electrically isolated from one another and the source structure; and conductive pillars vertically extending through the stack structure to the discrete conductive structures of the source tier.

The methods, structures (e.g., the microelectronic device structures 100, 600), devices (e.g., the microelectronic device 601), and systems (e.g., the electronic system 700) of the disclosure advantageously facilitate one or more of improved performance, reliability, and durability, lower costs, increased miniaturization of components, improved pattern quality, and greater packaging density as compared to conventional structures, conventional devices, and conventional systems. By way of non-limiting example, the methods and configurations of the disclosure may reduce the risk undesirable current leakage and short circuits (e.g., SGD-SGD current leakage and short circuits) as compared to conventional methods and configurations.

Figure 8:
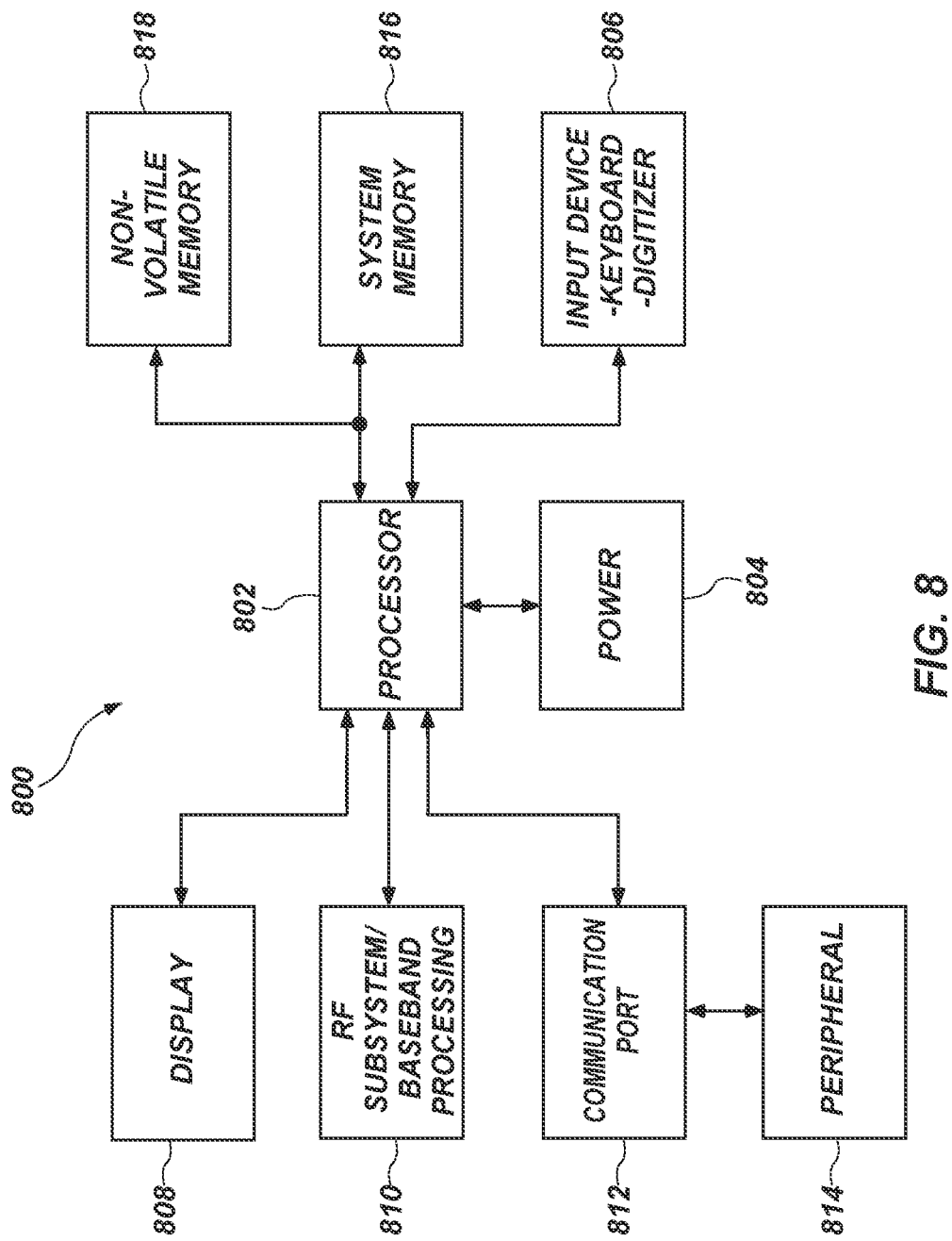
FIG. 8 is a schematic block diagram of a processor-based system, in accordance with embodiments of the disclosure.

With reference to FIG. 8, depicted is a processor-based system 800. The processor-based system 800 may include various microelectronic devices and microelectronic device structures (e.g., microelectronic devices and microelectronic device structures including one or more of the microelectronic device 601 or the microelectronic device structures 100, 600) manufactured in accordance with embodiments of the disclosure. The processor-based system 800 may be any of a variety of types such as a computer, pager, cellular phone, personal organizer, control circuit, or other electronic device. The processor-based system 800 may include one or more processors 802, such as a microprocessor, to control the processing of system functions and requests in the processor-based system 800. The processor 802 and other subcomponents of the processor-based system 800 may include microelectronic devices and microelectronic device structures (e.g., microelectronic devices and microelectronic device structures including one or more of the microelectronic device 601 or the microelectronic device structure 100, 600) manufactured in accordance with embodiments of the disclosure.

The processor-based system 800 may include a power supply 804 in operable communication with the processor 802. For example, if the processor-based system 800 is a portable system, the power supply 804 may include one or more of a fuel cell, a power scavenging device, permanent batteries, replaceable batteries, and rechargeable batteries. The power supply 804 may also include an AC adapter; therefore, the processor-based system 800 may be plugged into a wall outlet, for example. The power supply 804 may also include a DC adapter such that the processor-based system 800 may be plugged into a vehicle cigarette lighter or a vehicle power port, for example.

Various other devices may be coupled to the processor 802 depending on the functions that the processor-based system 800 performs. For example, a user interface 806 may be coupled to the processor 802. The user interface 806 may include input devices such as buttons, switches, a keyboard, a light pen, a mouse, a digitizer and stylus, a touch screen, a voice recognition system, a microphone, or a combination thereof. A display 808 may also be coupled to the processor 802. The display 808 may include an LCD display, an SED display, a CRT display, a DLP display, a plasma display, an OLED display, an LED display, a three-dimensional projection, an audio display, or a combination thereof. Furthermore, an RF sub-system/baseband processor 810 may also be coupled to the processor 802. The RF sub-system/baseband processor 810 may include an antenna that is coupled to an RF receiver and to an RF transmitter (not shown). A communication port 812, or more than one communication port 812, may also be coupled to the processor 802. The communication port 812 may be adapted to be coupled to one or more peripheral devices 814, such as a modem, a printer, a computer, a scanner, or a camera, or to a network, such as a local area network, remote area network, intranet, or the Internet, for example.

The processor 802 may control the processor-based system 800 by implementing software programs stored in the memory. The software programs may include an operating system, database software, drafting software, word processing software, media editing software, or media playing software, for example. The memory is operably coupled to the processor 802 to store and facilitate execution of various programs. For example, the processor 802 may be coupled to system memory 816, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 816 may include volatile memory, non-volatile memory, or a combination thereof. The system memory 816 is typically large so that it can store dynamically loaded applications and data. In some embodiments, the system memory 816 may include semiconductor devices, such as the microelectronic devices and microelectronic device structures (e.g., the microelectronic device 301 and the microelectronic device structures 100, 300) described above, or a combination thereof.

The processor 802 may also be coupled to non-volatile memory 818, which is not to suggest that system memory 816 is necessarily volatile. The non-volatile memory 818 may include one or more of STT-MRAM, MRAM, read-only memory (ROM) such as an EPROM, resistive read-only memory (RROM), and flash memory to be used in conjunction with the system memory 816. The size of the non-volatile memory 818 is typically selected to be just large enough to store any necessary operating system, application programs, and fixed data. Additionally, the non-volatile memory 818 may include a high-capacity memory such as disk drive memory, such as a hybrid-drive including resistive memory or other types of non-volatile solid-state memory, for example. The non-volatile memory 818 may include microelectronic devices, such as the microelectronic devices and microelectronic device structures (e.g., the microelectronic device 601 and the microelectronic device structure 100, 600) described above, or a combination thereof.

Embodiments of the disclosure include methods of forming a microelectronic device. The methods include forming a microelectronic device structure. The microelectronic device structure includes a stack structure having a vertically alternating sequence of electrically conductive structures and insulative structures arranged in tiers. The stack structure includes a stack structure comprising a vertically alternating sequence of conductive structures and insulative structures arranged in tiers, the stack structure divided into blocks separated from one another by filled slots. Each of blocks includes an upper stadium structure, a lower stadium structure, and a crest region defined between a first stair step structure of the upper stadium structure and a second stair step structure of the lower stadium structure. The microelectronic device structure further includes dielectric structures extending in parallel across the upper stadium structure and into the crest region, the dielectric structures vertically extending through and segmenting the conducive structures of some of the tiers to form upper select gates. The methods further include forming a trench to extend between and partially overlap two of the dielectric structures in at least the crest region of one or more of the blocks of the stack structure and at least substantially filling the trench with a dielectric material.

Some embodiments of the disclosure include a microelectronic device. The microelectronic device includes a stack structure including a vertically alternating sequence of conductive structures and insulative structures arranged in tiers, the stack structure divided into blocks separated from one another by filled slots. Each block includes an upper stadium structure comprising a first stair step structure having a negative slope facing an additional first stair step structure having a positive slope, a lower stadium structure comprising a second stair step structure having a negative slope facing an additional second stair step structure having a positive slope, and a crest region horizontally interposed between the additional first stair step structure of the upper stadium structure and the second stair step structure of the lower stadium structure. The microelectronic device further includes dielectric filled trenches horizontally extending parallel across the upper stadium structure and into the crest region, the dielectric filled trenches vertically extending through and physically separating the conducive structures of some of the tiers to define upper select gates in each of the blocks of the stack structure and at least one additional dielectric filled trench within at least the crest region of one or more of the blocks of the stack structure, the at least one additional dielectric filled trench horizontally extending between and partially overlapping two of the dielectric filled trenches within horizontal boundaries of the one or more of the blocks.

Additional embodiments of the disclosure include a memory device including a stack structure comprising a vertically alternating sequence of conductive structures and insulative structures arranged in tiers. The stack structure includes an upper segmented stadium structure includes opposing staircase structures each having steps comprising edges of some of the tiers of the stack structure and bridge structures adjacent horizontal boundaries of the opposing staircase structures in a first horizontal direction and comprising portions of the some of the tiers extending from and between the opposing staircase structures in a second horizontal direction orthogonal to the first horizontal direction. The stack structure further includes a lower segmented stadium structure neighboring the upper segmented stadium structure in the second horizontal direction and a crest region interposed between the upper segmented stadium structure and the lower segmented stadium structure in the second horizontal direction. The memory device further includes dielectric filled slot structures extending in parallel across the upper stadium structure in the second horizontal direction, the dielectric filled slot structures vertically extending through and separating the conducive structures of the some tiers to define upper select gates, at least one filled trench horizontally extending through crest region of the stack structure and to the dielectric filled slot structures in the second horizontal direction, the at least one filled trench interposed between a pair of the dielectric filled trenches in the first horizontal direction, and strings of memory cells vertically extending through the stack structure.

Embodiments of the disclosure include an electronic system. The electronic system includes an input device, an output device, a processor device operably coupled to the input device and the output device, and a memory device operably coupled to the processor device and including a microelectronic device structure. The microelectronic device structure including a stack structure comprising vertically alternating sequence of electrically conductive structures and insulating structures arranged in tiers. The stack structure may include a stadium structure having steps comprising horizontal ends of groups of drain select gates interposed between dielectric filled slot structures partially extending into the stack structure and a crest region extending horizontally from an uppermost stair of the stadium structure. The memory device further includes a filled trench vertically extending through at least the crest region of the stack structure, the filled trench electrically isolating a first of the groups of drain select gates from a second of the groups of drain select gates.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A method of forming a microelectronic device, comprising:
forming a microelectronic device comprising:
a stack structure comprising a vertically alternating sequence of conductive structures and insulative structures arranged in tiers, the stack structure divided into blocks separated from one another by filled slots, each block comprising:
an upper stadium structure comprising a first stair step structure having a negative slope facing an additional first stair step structure having a positive slope;
a lower stadium structure comprising a second stair step structure having a negative slope facing an additional second stair step structure having a positive slope; and
a crest region horizontally interposed between the additional first stair step structure of the upper stadium structure and the second stair step structure of the lower stadium structure;
dielectric filled trenches horizontally extending in parallel across at least a portion of the upper stadium structure and into the crest region, the dielectric filled trenches vertically extending through and physically separating the conductive structures of some of the tiers to define upper select gates in each of the blocks of the stack structure; and
forming at least one additional dielectric filled trench within at least the crest region of one or more of the blocks of the stack structure, the at least one additional dielectric filled trench horizontally extending between and partially overlapping two of the dielectric filled trenches within horizontal boundaries of the one or more of the blocks.

2. The method of claim 1, wherein forming a trench comprises removing portions of some of the upper select gates of the one or more blocks of the stack structure.

3. The method of claim 1, wherein forming a trench comprises forming a lower vertical boundary of the trench to be at or below a lower vertical boundary of the upper select gates of a lowermost tier of the some of the tiers.

4. The method of claim 1, wherein forming a trench comprises forming a width of the trench to be substantially equal to a distance between to the two of the dielectric filled trenches.

5. The method of claim 1, wherein forming a trench comprises electrically separating a first group of the upper select gates from a second group of the upper select gates within the crest region of the one or more of the blocks.

6. The method of claim 1, wherein forming a trench comprises forming the trench to vertically extend through at least eight of the tiers of the stack structure.

7. The method of claim 1, wherein forming a trench comprises:
forming a mask material over the stack structure;
forming one or more elongated openings in the mask material to form a patterned mask material; and
removing portions of the one or more blocks of the stack structure through the one or more elongated openings.

8. The method of claim 1, further comprising support pillar structures extending vertically through the stack structure.

9. A microelectronic device, comprising:
a stack structure comprising a vertically alternating sequence of conductive structures and insulative structures arranged in tiers, the stack structure divided into blocks separated from one another by filled slots, each block comprising:
an upper stadium structure comprising a first stair step structure having a negative slope facing an additional first stair step structure having a positive slope;
a lower stadium structure comprising a second stair step structure having a negative slope facing an additional second stair step structure having a positive slope; and
a crest region horizontally interposed between the additional first stair step structure of the upper stadium structure and the second stair step structure of the lower stadium structure;
dielectric filled trenches horizontally extending in parallel across at least a portion of the upper stadium structure and into the crest region, the dielectric filled trenches vertically extending through and physically separating the conductive structures of some of the tiers to define upper select gates in each of the blocks of the stack structure; and
at least one additional dielectric filled trench within at least the crest region of one or more of the blocks of the stack structure, the at least one additional dielectric filled trench horizontally extending between and partially overlapping two of the dielectric filled trenches within horizontal boundaries of the one or more of the blocks.

10. The microelectronic device of claim 9, wherein the upper stadium structure comprises an upper segmented stadium comprising bridge structures adjacent horizontal boundaries of the first stair step structure in a first horizontal direction and comprising portions of the some of the tiers extending from and between the first stair step structure and the additional first stair step structure in a second horizontal direction orthogonal to the first horizontal direction.

11. The microelectronic device of claim 9, wherein the lower stadium structure comprises a lower segmented stadium structure.

12. The microelectronic device of claim 9, wherein a lowermost boundary of the at least one additional dielectric filled trench vertically overlies a lowermost boundary of the upper stadium structure of the one or more blocks of the stack structure.

13. The microelectronic device of claim 9, wherein a lowermost boundary of the at least one additional dielectric filled trench vertically overlies an uppermost boundary of the lower stadium structure of the one or more blocks of the stack structure.

14. The microelectronic device of claim 9, further comprising support pillar structures extending vertically through the stack structure.

15. The microelectronic device of claim 9, wherein the at least one additional dielectric filled trench horizontally extends from and between opposing horizontal boundaries of the two of the dielectric filled trenches.

16. The microelectronic device of claim 9, wherein a lower vertical boundary of the filled trench is positioned at or vertically below a lower vertical boundary of the upper select gates of a lowermost tier of the some of the tiers.

17. The microelectronic device of claim 9, wherein the some of the tiers of the stack structure comprises least eight of the tiers of stack structure.

18. The microelectronic device of claim 9, further comprising a source tier underlying the stack structure and comprising a source plate.

19. A memory device, comprising:
a stack structure comprising a vertically alternating sequence of conductive structures and insulative structures arranged in tiers, the stack structure further comprising:
an upper segmented stadium structure comprising:
opposing staircase structures each having steps comprising edges of some of the tiers of the stack structure; and
bridge structures adjacent horizontal boundaries of the opposing staircase structures in a first horizontal direction and comprising portions of the some of the tiers extending from and between the opposing staircase structures in a second horizontal direction orthogonal to the first horizontal direction;
a lower segmented stadium structure neighboring the upper segmented stadium structure in the second horizontal direction; and
a crest region interposed between the upper segmented stadium structure and the lower segmented stadium structure in the second horizontal direction;
dielectric filled slot structures extending in parallel across a portion of the upper segmented stadium structure in the second horizontal direction, the dielectric filled slot structures vertically extending through and separating the conductive structures of some tiers to define upper select gates;
at least one filled trench horizontally extending through crest region of the stack structure and to the dielectric filled slot structures in the second horizontal direction, the at least one filled trench interposed between a pair of the dielectric filled slot structures in the first horizontal direction; and
strings of memory cells vertically extending through the stack structure.

20. The memory device of claim 19, wherein the filled trench electrically separates a first group of the upper select gates from a second group of the upper select gates.

21. The memory device of claim 19, further comprising support pillar structures extending vertically through the stack structure.

22. The memory device of claim 21, further comprising:
access line contact structures on the steps of the upper segmented stadium structure and the lower stadium structure;
data lines overlying the stack structure;
access lines electrically connected to the access line contact structures; and
a control device comprising CMOS circuitry vertically underlying a source tier comprising a source plate and within horizontal boundaries of the support pillar structures, the control device electrically coupled to the source plate, the data lines, and the access lines.

23. The memory device of claim 19, wherein the some of the tiers of the stack structure comprises at least four of the tiers of the stack structure.

24. An electronic system, comprising:
an input device;
an output device;
a processor device operably coupled to the input device and the output device; and
a memory device operably coupled to the processor device and comprising:
a stack structure comprising a vertically alternating sequence of conductive structures and insulative structures arranged in tiers, the stack structure further comprising:
an upper segmented stadium structure comprising:
opposing staircase structures each having steps comprising edges of some of the tiers of the stack structure; and
bridge structures adjacent horizontal boundaries of the opposing staircase structures in a first horizontal direction and comprising portions of the some of the tiers extending from and between the opposing staircase structures in a second horizontal direction orthogonal to the first horizontal direction;
a lower segmented stadium structure neighboring the upper segmented stadium structure in the second horizontal direction; and
a crest region interposed between the upper segmented stadium structure and the lower segmented stadium structure in the second horizontal direction;
dielectric filled slot structures extending in parallel across a portion of the upper segmented stadium structure in the second horizontal direction, the dielectric filled slot structures vertically extending through and separating the conductive structures of some tiers to define upper select gates;
at least one filled trench horizontally extending through crest region of the stack structure and to the dielectric filled slot structures in the second horizontal direction, the at least one filled trench interposed between a pair of the dielectric filled slot structures in the first horizontal direction; and
strings of memory cells vertically extending through the stack structure.

25. The electronic system of claim 24, wherein the memory device comprises a multi-deck 3D NAND Flash memory device.

* * * * *

UNITED STATES PATENT AND TRADEMARK OFFICE
CERTIFICATE OF CORRECTION

PATENT NO. : 11,785,775 B2
APPLICATION NO. : 17/153740
DATED : October 10, 2023
INVENTOR(S) : Lifang Xu et al.

It is certified that error appears in the above-identified patent and that said Letters Patent is hereby corrected as shown below:

In the Specification

| | | |
|---|---|---|
| Column 5, | Line 56, | change "palladium (Pa)," to --palladium (Pd),-- |
| Column 7, | Line 21, | change "FIGS. 2A to 2C to" to --FIGS. 2A-2C to-- |
| Column 10, | Line 37, | change "(e.g., Sift). Each" to --(e.g., SiO$_2$). Each-- |
| Column 11, | Line 55, | change "about 20.0 such" to --about 20.0 µm, such-- |
| Column 11, | Line 56, | change "about 10.0 from" to --about 10.0 µm, from-- |
| Column 11, | Line 57, | change "about 15.0 or" to --about 15.0 µm, or-- |
| Column 11, | Line 57, | change "about 20.0 In" to --about 20.0 µm. In-- |
| Column 11, | Line 58, | change "about 13.5 However" to --about 13.5 µm. However-- |
| Column 12, | Line 26, | change "SiO$_x$ (e.g., Sift)." to --SiO$_x$ (e.g., SiO$_2$).-- |
| Column 13, | Line 67, | change "153 comprises Sift." to --153 comprises SiO$_2$.-- |

In the Claims

| | | | |
|---|---|---|---|
| Claim 4, | Column 27, | Line 52, | change "between to the two of the" to --between two of the-- |
| Claim 17, | Column 29, | Line 2, | change "comprises least" to --comprises at least-- |

Signed and Sealed this
Thirteenth Day of February, 2024

Katherine Kelly Vidal
*Director of the United States Patent and Trademark Office*